US009230663B1

(12) United States Patent
Lu et al.

(10) Patent No.: US 9,230,663 B1
(45) Date of Patent: Jan. 5, 2016

(54) PROGRAMMING MEMORY WITH REDUCED SHORT-TERM CHARGE LOSS

(71) Applicant: SanDisk Technologies Inc., Plano, TX (US)

(72) Inventors: Ching-Huang Lu, Fremont, CA (US); Yingda Dong, San Jose, CA (US); Liang Pang, Fremont, CA (US); Tien-Chien Kuo, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/472,872

(22) Filed: Aug. 29, 2014

(51) Int. Cl.
*G11C 16/00* (2006.01)
*G11C 16/10* (2006.01)
*G11C 16/34* (2006.01)
*G11C 16/04* (2006.01)

(52) U.S. Cl.
CPC ............ *G11C 16/10* (2013.01); *G11C 16/0466* (2013.01); *G11C 16/3459* (2013.01)

(58) Field of Classification Search
CPC .... G11C 16/10; G11C 16/06; G11C 16/0466; G11C 16/3459
USPC ............................ 365/185.19, 185.03, 185.22
See application file for complete search history.

(56) References Cited

U.S. PATENT DOCUMENTS

| 5,452,251 | A  | * | 9/1995  | Akaogi ............... | G11C 5/145 |
| | | | | | 365/185.13 |
| 5,867,428 | A  | * | 2/1999  | Ishii .................. | G11C 16/0491 |
| | | | | | 365/185.18 |
| 6,498,752 | B1 | * | 12/2002 | Hsu ................... | G11C 16/16 |
| | | | | | 365/185.18 |
| 7,319,616 | B2 |   | 1/2008  | Sundaram et al. | |

(Continued)

OTHER PUBLICATIONS

U.S. Appl. No. 14/331,784, filed Jul. 15, 2014.

(Continued)

*Primary Examiner* — Tan T Nguyen
(74) *Attorney, Agent, or Firm* — Vierra Magen Marcus LLP

(57) ABSTRACT

Techniques are provided for reducing the effects of short-term charge loss while programming charge-trapping memory cells. Short-term charge loss can result in a downshift and widening of a threshold voltage distribution. A programming operation includes a rough programming pass in which memory cells are programmed close to a final threshold voltage distribution, for each target data state. Subsequently, a negative voltage is applied to control gates of the memory cells. Subsequently, a final programming pass is performed in which the memory cells are programmed to the final threshold voltage distribution. Since the negative voltage accelerates charge loss, there is reduced charge loss after the final programming pass. The rough programming pass can use incremental step pulse programming for the lowest target data state to obtain information regarding programming speed. An initial program voltage in the final programming pass can be set based on the programming speed.

25 Claims, 17 Drawing Sheets

(56) References Cited

U.S. PATENT DOCUMENTS

| | | |
|---|---|---|
| 7,349,261 B2 | 3/2008 | Mokhlesi |
| 7,619,933 B2 | 11/2009 | Sarin |
| 7,633,803 B2 | 12/2009 | Lee |
| 7,924,587 B2 | 4/2011 | Perlmutter et al. |
| 8,203,876 B2 | 6/2012 | Goda et al. |
| 8,213,233 B2 | 7/2012 | Sarin et al. |
| 8,634,249 B2 | 1/2014 | Yang |
| 2006/0126394 A1 | 6/2006 | Li et al. |
| 2007/0025166 A1 | 2/2007 | Fang et al. |
| 2009/0052255 A1 | 2/2009 | Moon et al. |
| 2011/0134701 A1 | 6/2011 | Moschiano et al. |
| 2012/0044771 A1* | 2/2012 | Joo .................... G11C 16/0483 365/185.22 |
| 2012/0081957 A1 | 4/2012 | Kim et al. |

OTHER PUBLICATIONS

U.S. Appl. No. 14/272,758, filed May 8, 2014.
U.S. Appl. No. 14/331,800, filed Jul. 15, 2014.
U.S. Appl. No. 13/772,729, filed Feb. 21, 2013.
International Search Report & the Written Opinion of the International Searching Authority dated Oct. 23, 2015, International Application No. PCT/US2015/043728.

* cited by examiner

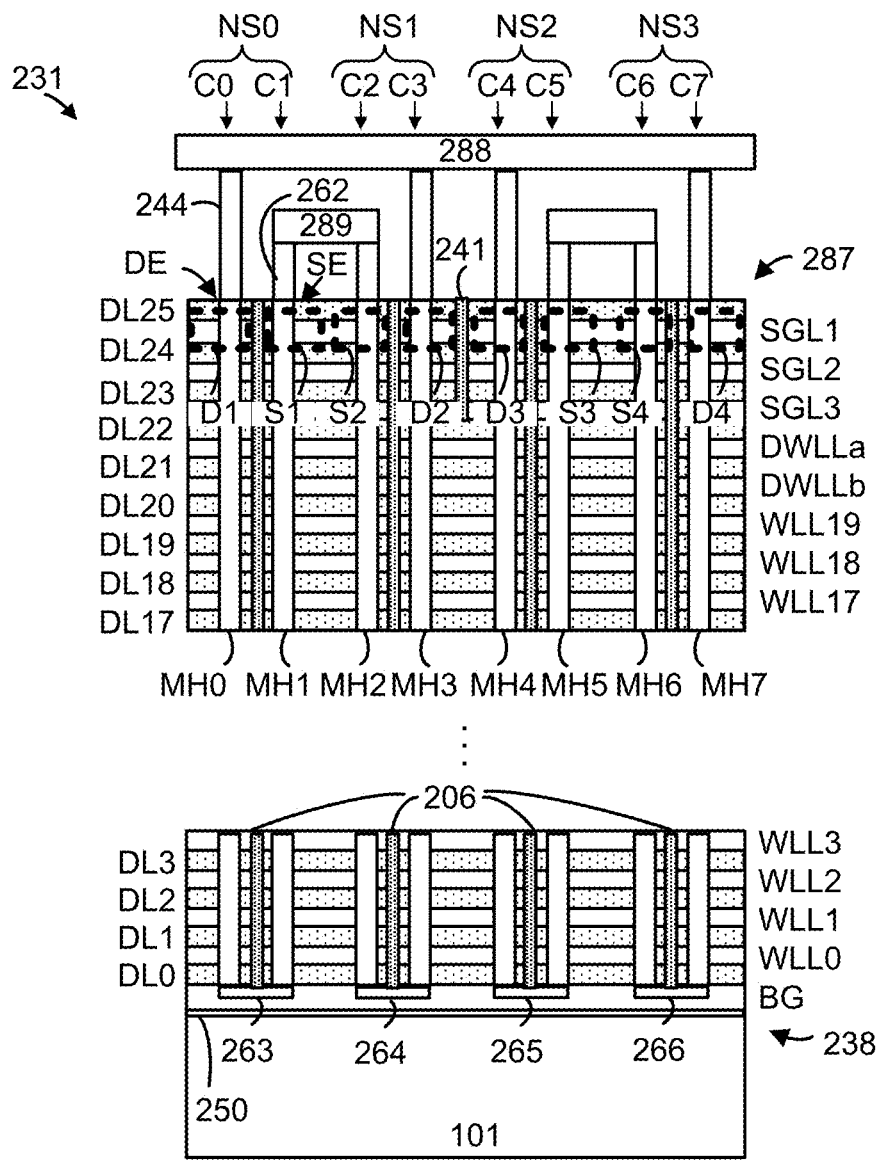

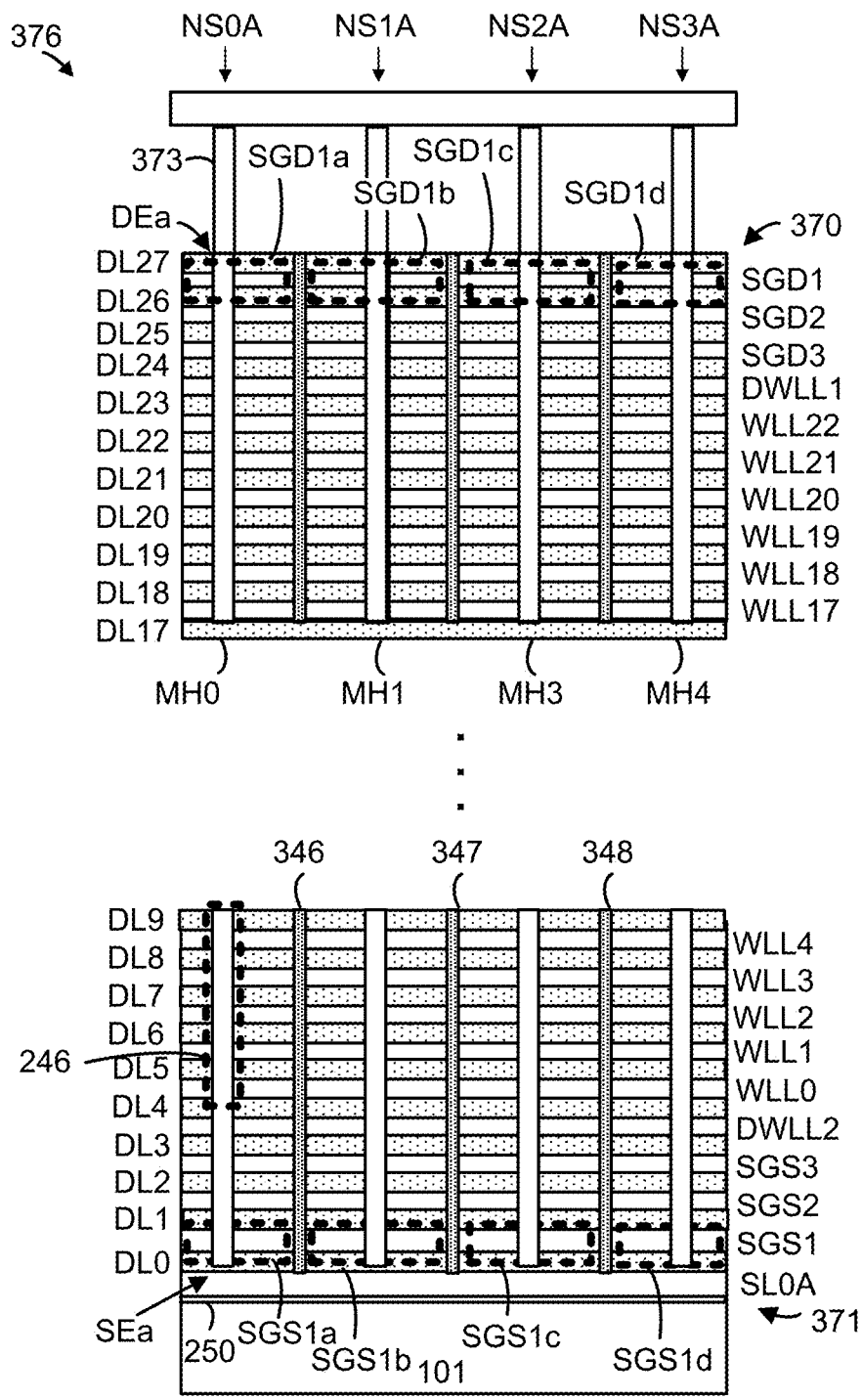

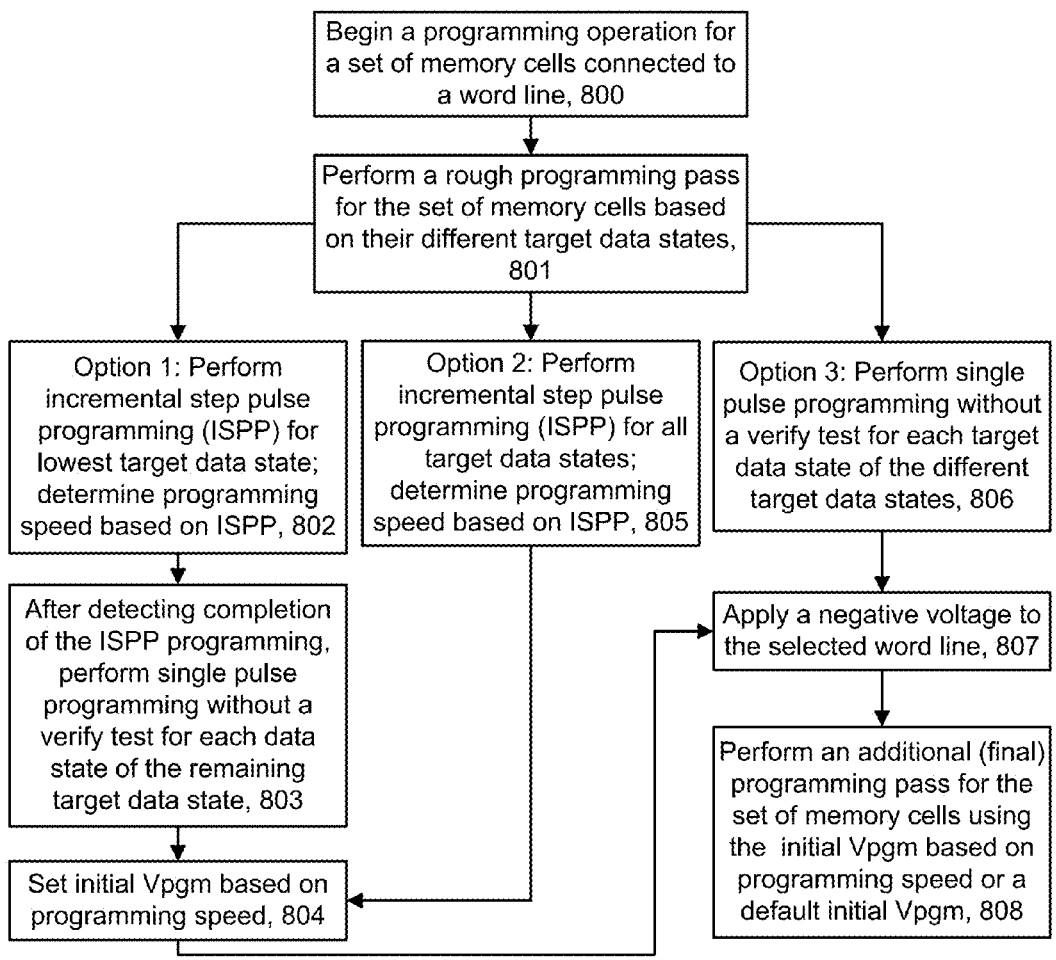
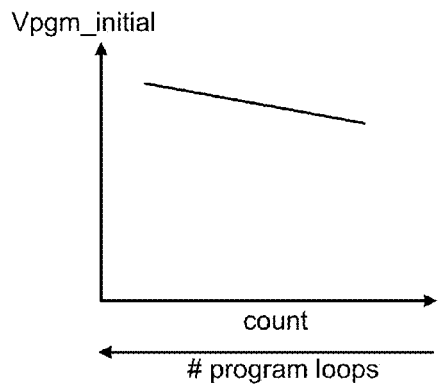

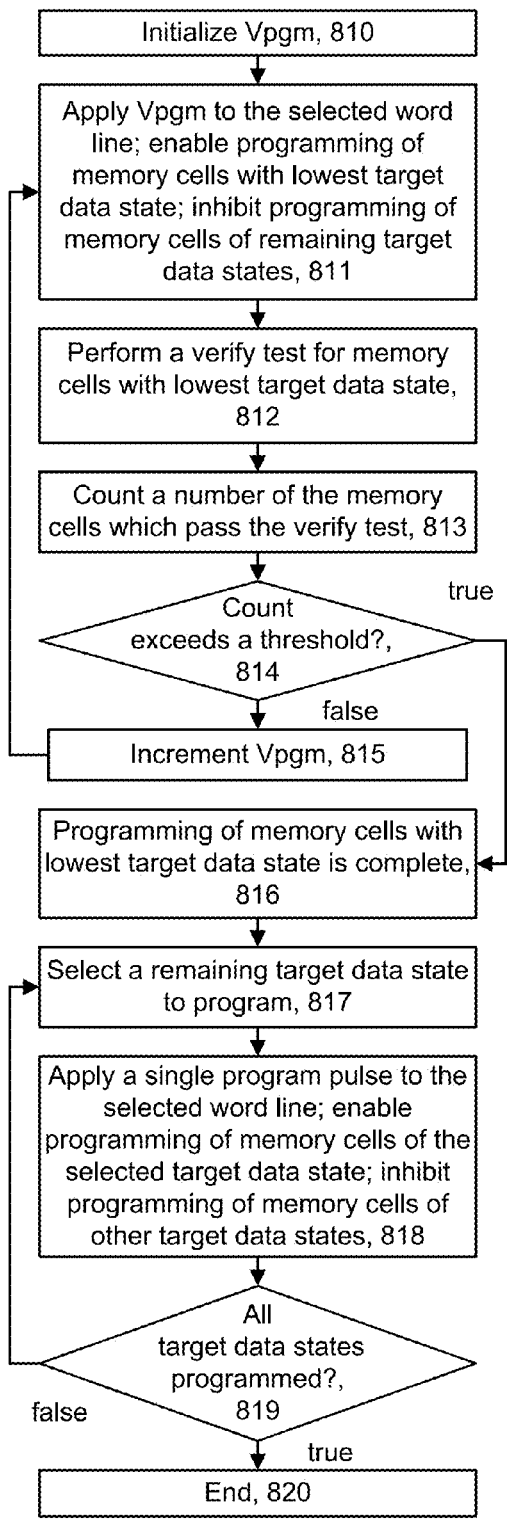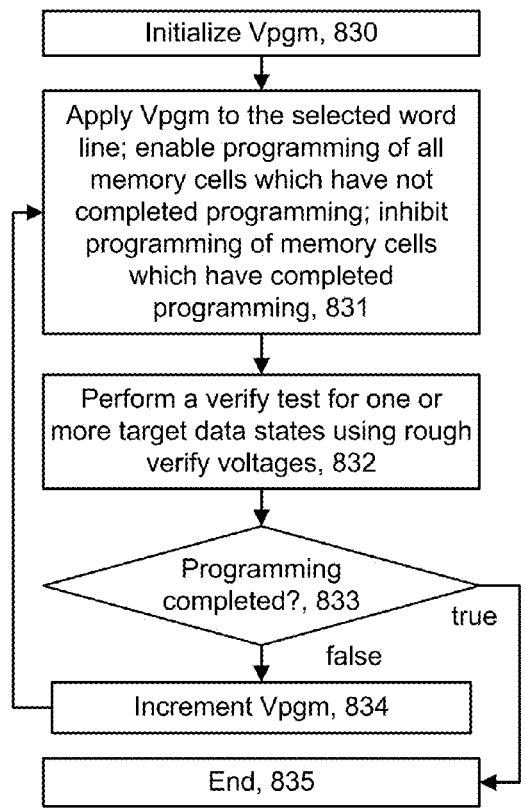

PROGRAMMING MEMORY WITH REDUCED SHORT-TERM CHARGE LOSS

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 2C depicts an embodiment of a stack 231 showing a cross-sectional view of the portion 209 of FIG. 2A, along line 220.

FIG. 3C depicts an embodiment of a stack 376 showing a cross-sectional view of the portion 307 of FIG. 3A, along line 305.

FIG. 8A depicts an example programming operation which reduces short-term charge loss in memory cells.

FIG. 8B depicts a plot showing the setting of an initial Vpgm in a final programming pass as a function of a count of memory cells or a number of program loops for the lowest target data state in a rough programming pass, consistent with step 804 of FIG. 8A.

FIG. 8C depicts an example process for performing incremental step pulse programming (ISPP) for the lowest target data state and single pulse programming for the remaining, higher target data states while determining a programming speed during a rough programming pass, consistent with step 802 of FIG. 8A.

FIG. 8D depicts an example process for performing ISPP for each target data state while determining a programming speed during a rough programming pass, consistent with step 805 of FIG. 8A.

DETAILED DESCRIPTION

Figure 1A:
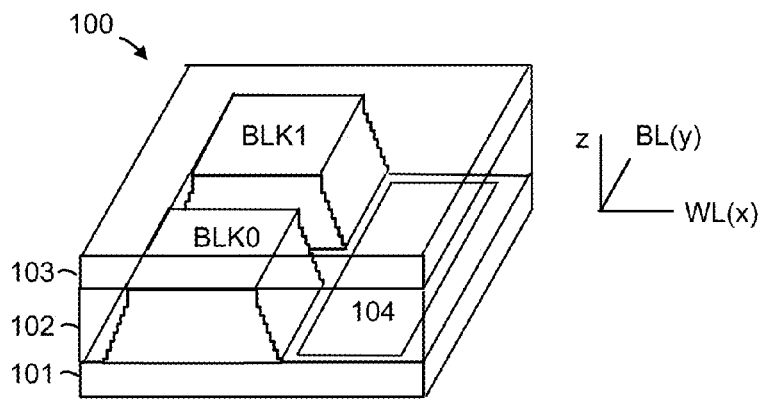
FIG. 1A is a perspective view of a 3D stacked non-volatile memory device.

Techniques are provided for programming charge-trapping memory cells with reduced short-term charge loss.

A charge-trapping memory device may use a charge-trapping material such as silicon nitride layer which is arranged between oxide layers (in an oxide-nitride-oxide or ONO configuration) next to a channel region. During programming, electrons move from the channel to the nitride layer. See FIGS. 4C and 5C. However, a short-term charge loss occurs due to fast charge de-trapping from shallow traps in the ONO layers into the channel. This can occur a few seconds after a memory cell has completed programming to a target data state according to a verify test. As a result of the charge loss, the threshold voltage (Vth) of the memory cell can decrease to the point where the target data state cannot be accurately read back from the memory cell. Generally, the charge loss causes a set of cells to have a widened Vth distribution which has downshifted below the verify voltage. This is in conflict with the need to provide narrow Vth distributions to allow multiple data states to be stored.

It has been observed that the amount of charge loss is proportional to the swing or change in Vth which a memory cell experiences when it is being programmed. Thus, a memory cell which is programmed from the erased state to a higher target data state will have a larger Vth swing, and a larger downshift in Vth after the memory cell has pass its verify test, than a memory cell which is programmed from the erased state to a lower target data state. This is true because more electrons are injected from the channel into the charge-trapping layer. Statistically, more electrons will be stopped by the shallow traps in the ONO layers. The higher population of electrons which experience fast detrapping leads to worse short-term data retention and a wider Vth distribution.

Techniques provided herein address the above-mentioned issues. The techniques involve performing a rough programming, in which a set of memory cells is programmed to threshold voltages comprising threshold voltages which are below final verify voltages of different target data states. The threshold voltages may optionally comprise threshold voltages which are above the final verify voltages as well. Subsequently, one or more negative voltages are applied to the control gates of the memory cells via a word line. The one or more negative voltages accelerate the charge loss from the shallow traps in the memory cells. Subsequently, a final programming is performed in which the set of memory cells is programmed to threshold voltages which are above the final verify voltages of the different target data states. Thus, there is a transition from Vth levels below the final verify levels to Vth levels above the final verify levels for at least some, and typically a majority, of the memory cells of each target data state. Since much of the charge loss from the shallow traps has occurred before the final programming, there will be less charge loss after the final programming. Additionally, the Vth swing for the memory cells between the rough programming and the final programming is less than if the memory cells were programmed directly from the erased state to the final verify voltages. As a result, fewer additional electrons are injected into the ONO layers and the amount of charge loss is reduced.

A goal of the rough programming is to quickly program the memory cells close to, but slightly below, the final verify voltages. One approach is to apply a single program pulse for the memory cells of each target data state, where no verify test is performed. For example, in a four-level memory cell, there is an erased (E) state, an A state, a B state and a C state. In this case, one program pulse can be applied for cells of the A state while enabling programming for these cells but inhibiting programming for the memory cells of other states (e.g., the B and C state cells), another program pulse can be applied for cells of the B state while enabling programming for these cells but inhibiting programming for the memory cells of other states (e.g., the A and C state cells), and an additional program pulse can be applied for cells of the C state while enabling programming for these cells but inhibiting programming for the memory cells of other states (e.g., the A and B state cells). The magnitude and duration of each of the single program pulses can be optimized for the target data state for which it is used.

While the above approach minimizes the duration of the rough programming, another approach is to perform incremental step pulse programming (ISPP) for the lowest target data state, e.g., the A state, until a programming milestone is reached. For example, this can occur when all, or a specified number, of the A state cells have passed a verify test. Furthermore, a measure of the programming speed can be obtained for the memory cells of the lowest target data state. For example, the programming speed is relatively faster when the memory cells of the lowest target data state reach the programming milestone with a relatively smaller number of program pulses. Or, the programming speed is relatively faster when a count is relatively higher of a number of the memory cells of the lowest target data state which pass a verify test after a specified number of program pulses. The programming speed can be used to set the initial program voltage for the final programming, such that the initial program voltage is relatively lower when the programming speed is relatively higher. After the ISPP of the memory cells of the lowest target data state, the rough programming can continue with single pulses for each of the remaining target data states (e.g., the B and C states).

Another option which uses additional time is to perform ISPP for each of the target data states during the rough programming. This allows the Vth distributions to be more precisely positioned closer to the final Vth distribution so that the Vth swing between the rough programming and the final programming is minimized.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
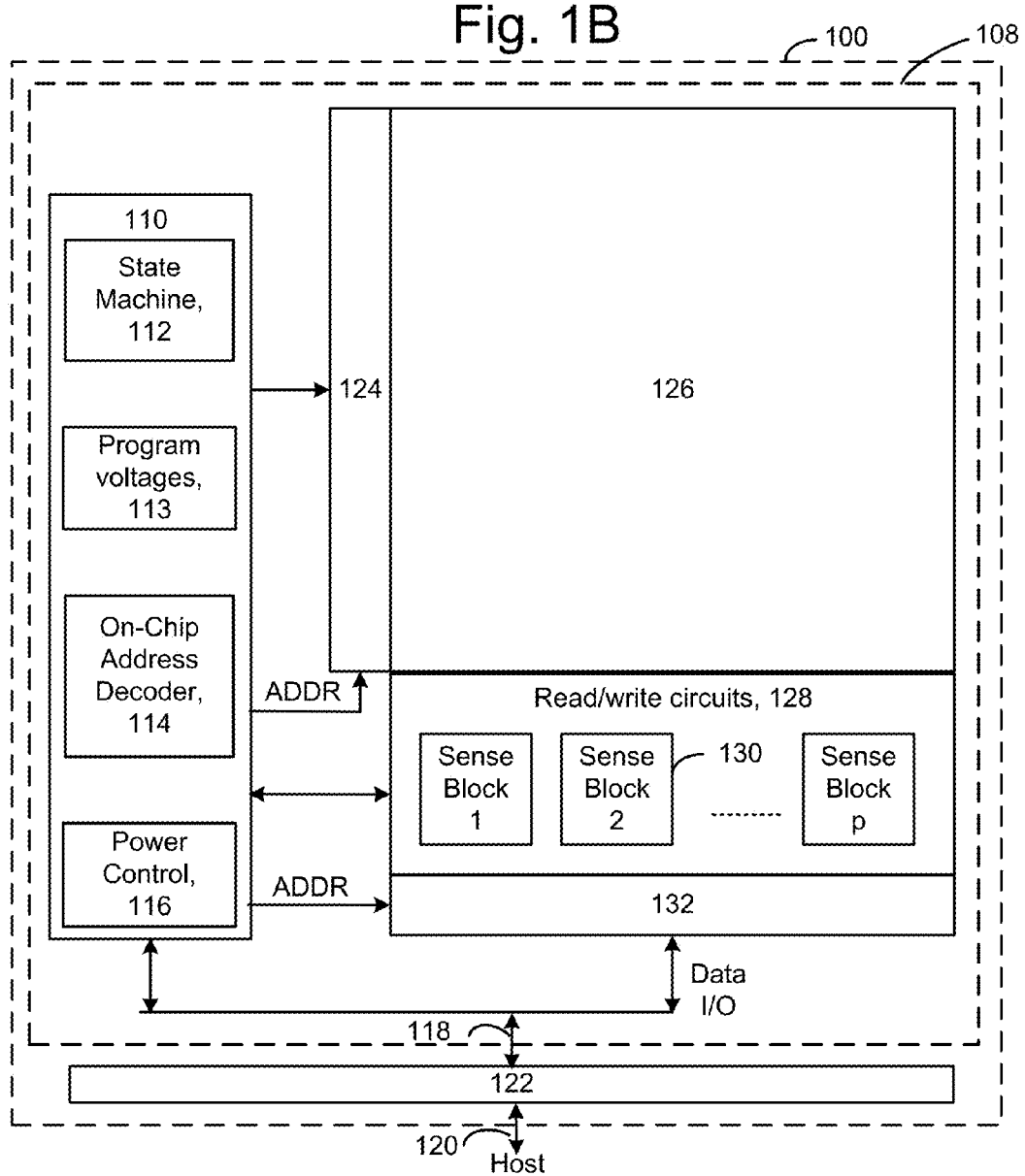
FIG. 1B is a functional block diagram of a memory device such as the 3D stacked non-volatile memory device 100 of FIG. 1A or a 2D memory device such as depicted in FIG. 5A to 5C.
Figure 5A:
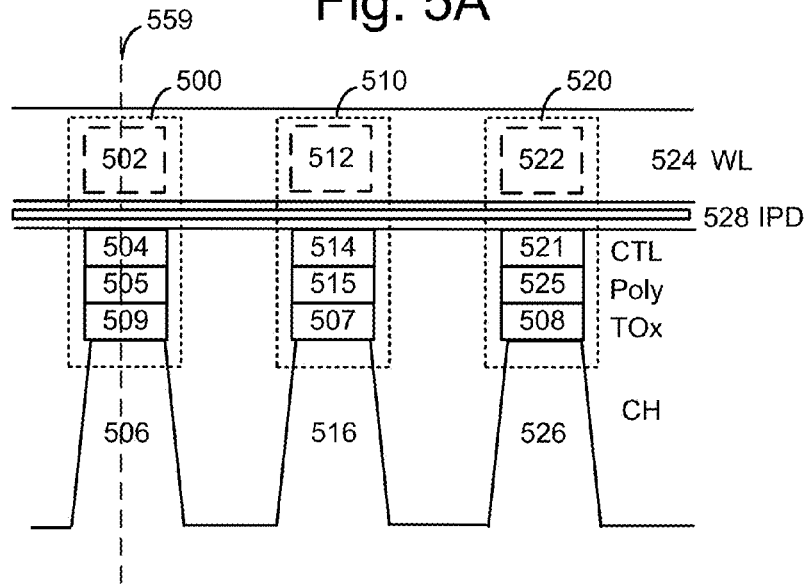
FIG. 5A depicts a cross-sectional view in a word line direction of memory cells comprising a flat control gate and charge-trapping regions as a 2D example of memory cells in the memory structure 126 of FIG. 1B.
Figure 5B:
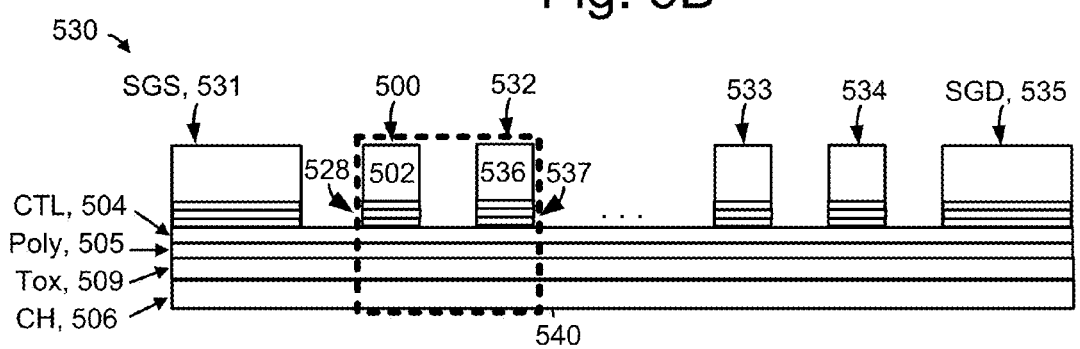
FIG. 5B depicts a cross sectional view along line 559 in FIG. 5A, showing a NAND string 530 having a flat control gate and a charge-trapping layer.
Figure 5C:
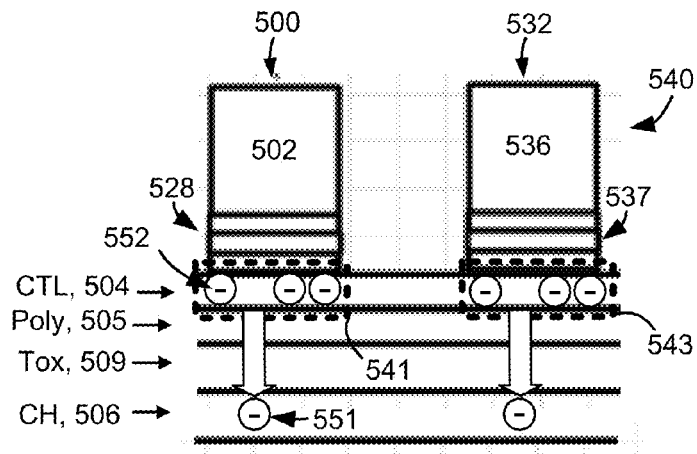
FIG. 5C depicts an expanded view of a portion 540 of the NAND string of FIG. 5B.

FIG. 1B is a functional block diagram of a memory device such as the 3D stacked non-volatile memory device 100 of FIG. 1A or a 2D memory device such as depicted in FIG. 5A to 5C. The memory device 100 may include one or more memory die 108. The memory die 108 includes a memory structure 126 of memory cells, such as an array of cells, control circuitry 110, and read/write circuits 128. In a 3D configuration, the memory array can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more array of memory cells including a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for program voltages in the memory device, such as an initial Vpgm to be used in a final programming pass.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2A:
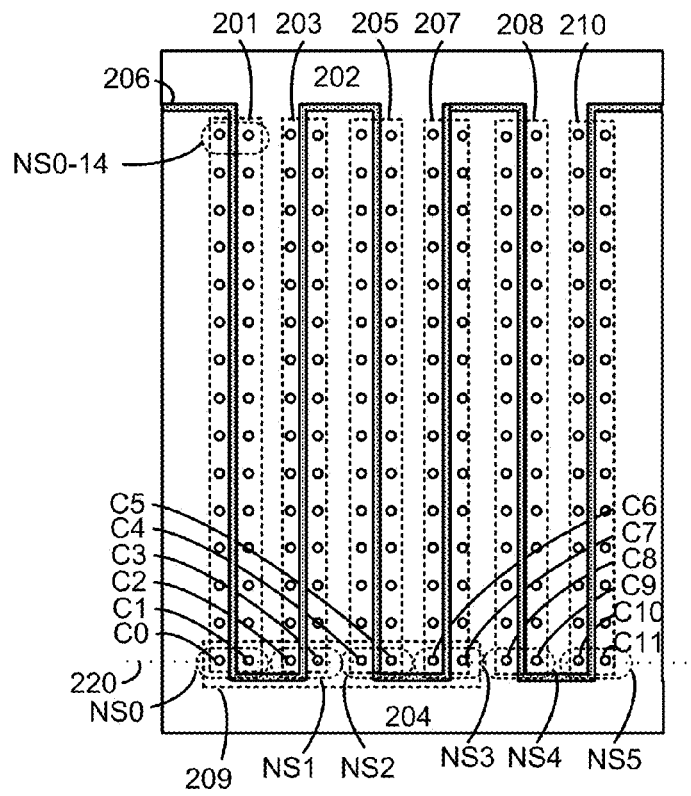
FIG. 2A depicts a top view of example word line layers 202 and 204 in a U-shaped NAND embodiment, as an example implementation of BLK0 in FIG. 1A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32,000 memory columns in the x direction, for a total of 384,000 memory columns in a block. With U-shaped NAND strings, 192,000 NAND strings are provided in this example. With straight NAND strings, 384,000 NAND strings are provided in this example. Assuming there are twenty-four memory cells per column, there are 384,000×24=9,216,000 memory cells in the set.

Figure 2B:
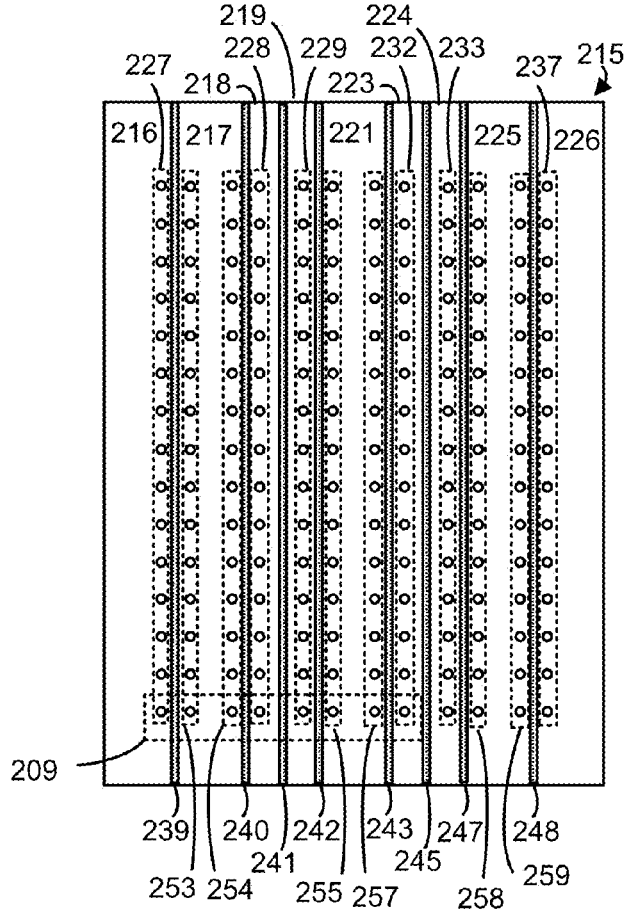
FIG. 2B depicts a top view of example select gate layer portions, consistent with FIG. 2A.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220. This example includes three select gate layers, SGL1, SGL2 and SGL3. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors, in SGL1.

Figure 3A:
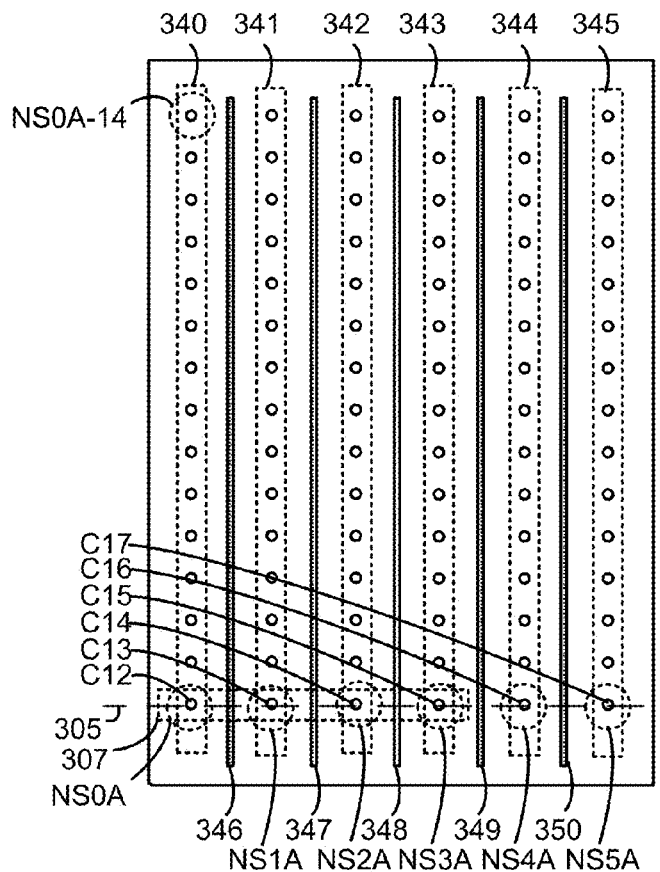
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

Figure 3B:
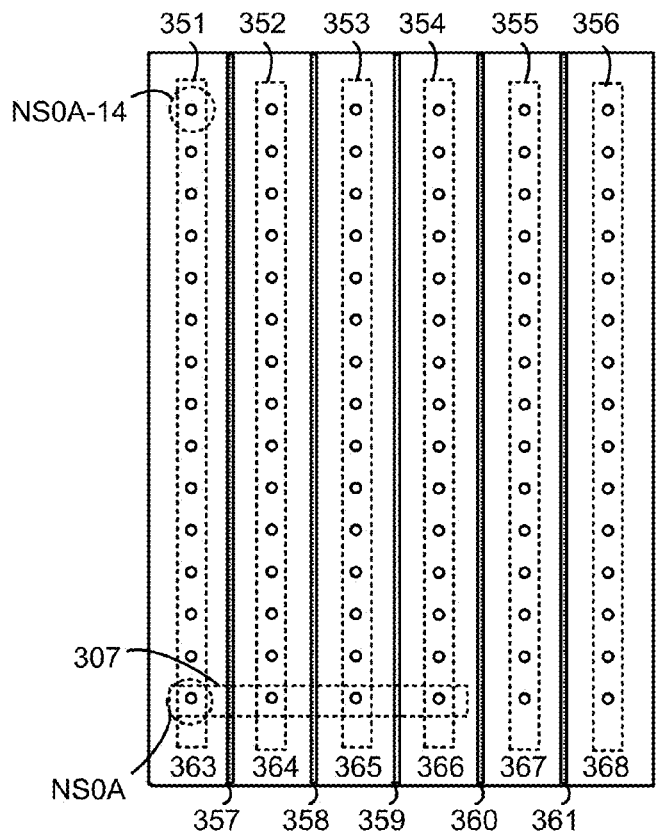
FIG. 3B depicts a top view of an example SGD layer 362, consistent with FIG. 3A.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C depicts an embodiment of a stack 376 showing a cross-sectional view of the portion 307 of FIG. 3A, along line 305. In this example, three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors SGS1$a$, SGS1$b$, SGS1$c$ and SGS1$d$ are formed in the SGS1 layer. Regions SGD1$a$, SGD1$b$, SGD1$c$ and SGD1$d$ represent SGD transistors.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string.

Figure 4A:
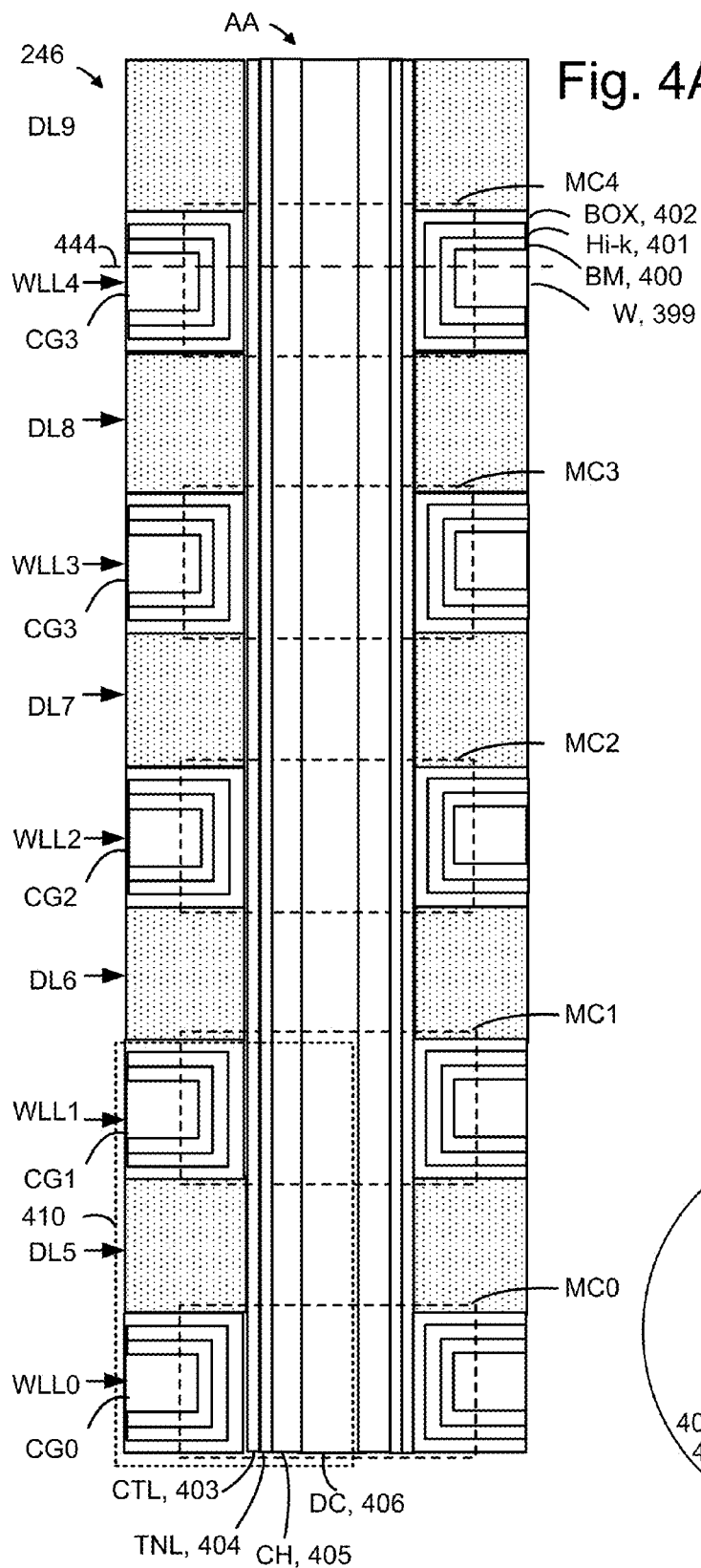
FIG. 4A depicts a view of the region 246 of FIG. 3C, showing memory cells MC1 to MC5.

A region 246 of the stack is shown in greater detail in FIG. 4A.

FIG. 4A depicts a view of the region 246 of FIG. 3C, showing memory cells MC1 to MC5. A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TNL) 404, a polysilicon body or channel (CH) 405, and a dielectric core (DC) 406. A word line layer includes a block oxide (BOX)

402, a block high-k material 401, a barrier metal 400, and a conductive metal such as W 399 as a control gate. For example, control gates CG0, CG1, CG2, CG3 and CG4 are provided for the memory cells MC0, MC1, MC2, MC3 and MC4, respectively. In another approach, all of these layers except the metal are provided in the column. Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge. During an erase operation, the electrons return to the channel.

Each of the memory holes can be filled with a plurality of annular layers comprising a block oxide layer, a charge-trapping layer, a tunneling layer and a channel layer. A core region of each of the memory holes is filled with a body material, and the plurality of annular layers are between the core region and the WLLs in each of the memory holes.

Figure 4B:
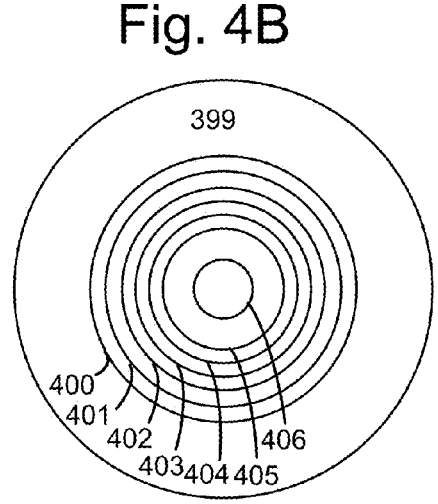
FIG. 4B depicts a cross-section view of the region 246 of FIG. 4A along line 444.

FIG. 4B depicts a cross-section view of the region 246 of FIG. 4A along line 444. Each layer is ring-shaped in one possible approach, except the core filler, which is a cylinder.

Figure 4C:
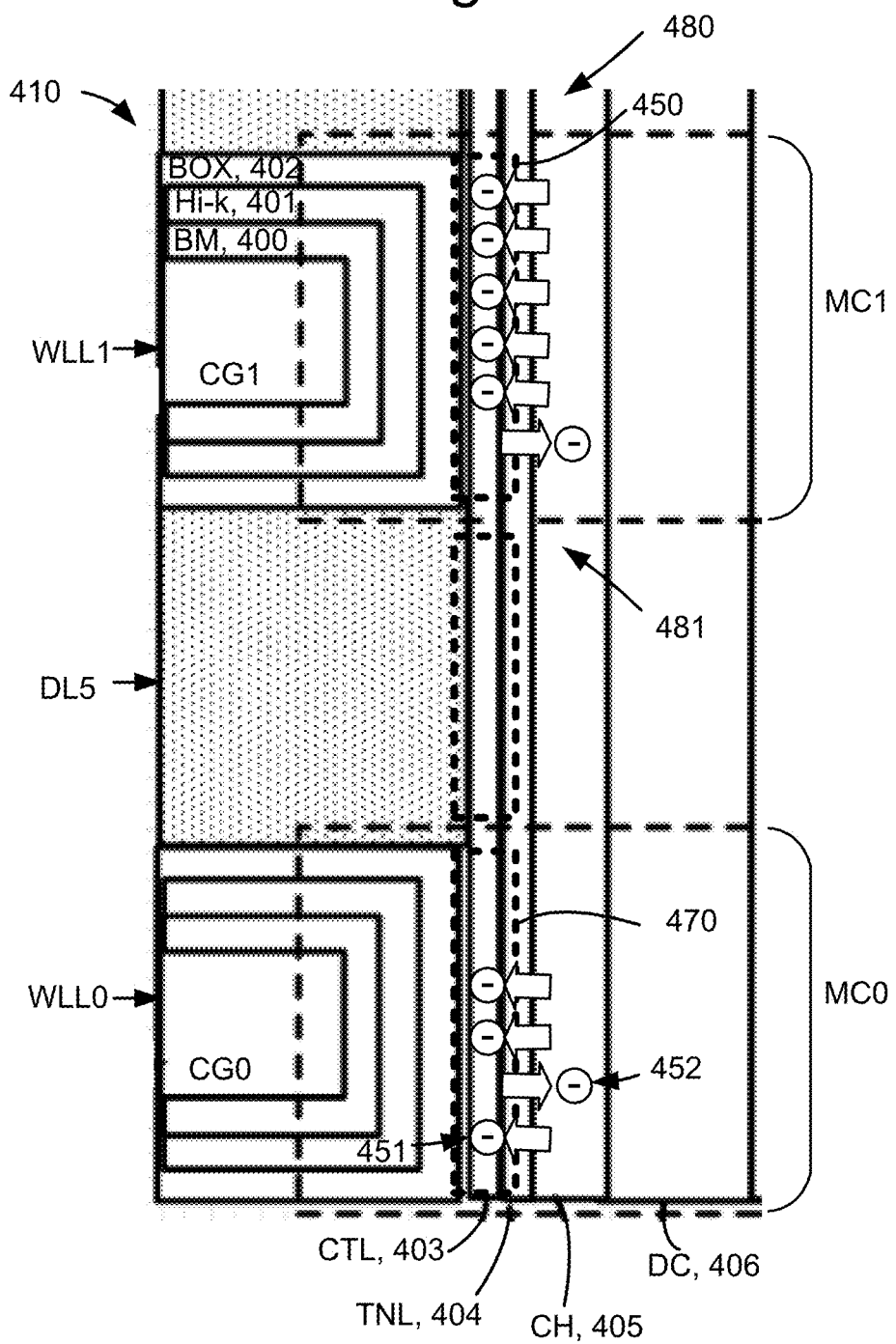
FIG. 4C depicts an expanded view of a portion 410 of the NAND string of FIG. 4A.

FIG. 4C depicts an expanded view of a portion 410 of the NAND string of FIG. 4A. When a program voltage is applied to the control gate of a memory cell via a respective word line, an electric field is generated. In MC0, the electric field causes electrons to tunnel into a region 470 of the charge-trapping layer 403, from the channel 405. Similarly, for MC1, the electric field causes electrons to tunnel into a region 450 of the charge-trapping layer 403, from the channel 405. The movement of the electrons into the charge-trapping layer is represented by the arrows which point to the left. The electrons are represented by circles with a dash inside the circle.

When a memory cell on a selected word line is subsequently read back, control gate read voltages such as VreadA, VreadB and VreadC (FIG. 10A) are applied to the memory cell while sensing circuitry determines whether the memory cell is in a conductive state. At the same time, a read pass voltage, Vread (e.g., 8-9 V), is applied to the remaining word lines.

However, as mentioned at the outset, the accuracy of the read back operation can be impaired by charge loss in the memory cells. Charge loss is represented by the arrows which point to the right. For example, an electron 452 is an example of a charge which has de-trapped from the charge-trapping region 470, lowering the Vth of MC0. An electron 451 is an example of a charge which remains in the charge-trapping region 470.

MC1 has a drain 480, a source 481 and a control gate CG1.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel oxide (TOx) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, . . . , 533 and 534, and an SGD transistor 535. The memory cell 500 includes the control gate 502 and an IPD portion 528 above the charge-trapping layer 504, the polysilicon layer 505, the tunnel oxide layer 509 and the channel region 506. The memory cell 532 includes a control gate 536 and an IPD portion 537 above the charge-trapping layer 504, the polysilicon layer 505, the tunnel oxide layer 509 and the channel region 506.

The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge-trapping or charge storing layer. The charge-trap layer can be a mix of silicon nitride and oxide, for instance. A difference between a floating gate memory cell and the flat memory cell is the height of the charge storage layer. A typically floating gate height may be about 100 nm, while a charge-trap layer can be as small as 3 nm, and the polysilicon layer can be about 5 nm. The SGD and SGS transistors have the same configuration as the storage elements but with a longer channel length to ensure that current is cutoff in an inhibited NAND string.

FIG. 5C depicts an expanded view of a portion 540 of the NAND string of FIG. 5B. The charge-trapping layer 504 includes regions 541 and 543 which are directly under and adjacent to the memory cells 500 and 532, respectively.

Charge loss can occur in a 2D memory device in a similar way as in the 3D memory device. Charge loss is represented by the arrows which point downward. For example, an electron 551 is an example of a charge which has de-trapped from the charge-trapping region 541, lowering the Vth of the memory cell 500. An electron 552 is an example of a charge which remains in the charge-trapping region 541.

Figure 6A:
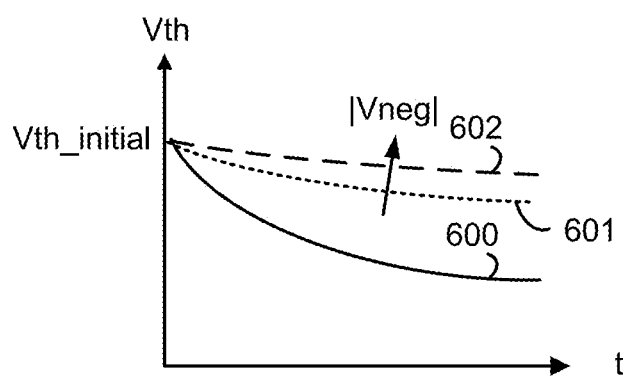
FIG. 6A depicts a plot showing a decrease in threshold voltage (Vth) as function of time due to de-trapping of electrons.

FIG. 6A depicts a plot showing a decrease in threshold voltage (Vth) as function of time due to de-trapping of electrons. The change in Vth is depicted for a representative target data state, and occurs after a memory cell has been programmed to its target data state. A plot 600 indicates that Vth drops quickly from an initial level, Vth initial, then gradually levels off. For example, most of the decrease may occur within several seconds, e.g., 10-20 seconds. In some cases, a decrease of, e.g., 0.5-0.8 V may be experienced. Plots 601 and 602 depict a much smaller drop in Vth due to the programming techniques described herein which include a rough programming followed by a negative control gate bias and then a final programming. |Vneg| denotes the magnitude of the negative control gate bias. A larger magnitude is associated with a smaller charge loss and a smaller decrease in Vth. A magnitude of, e.g., −5 V to −10 V may be used.

Figure 6B:
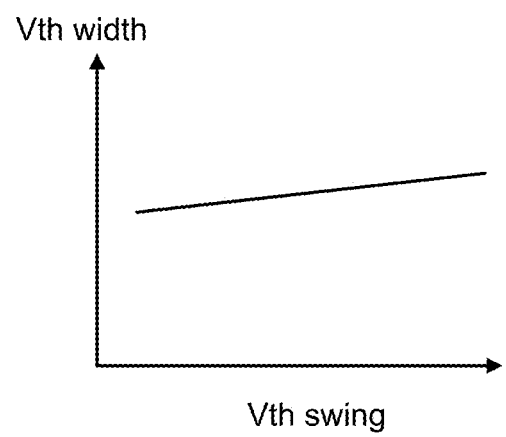
FIG. 6B depicts a plot showing an increase in the width of a Vth distribution as function of a swing in Vth during a programming operation.

FIG. 6B depicts a plot showing an increase in the width of a threshold voltage distribution as function of a swing in Vth during a programming operation. This plot indicates that when there is a larger Vth swing, the Vth width is larger. Typically, the higher data states will have a larger Vth swing. The Vth width may be a six-sigma measurement, for example.

Figure 7:
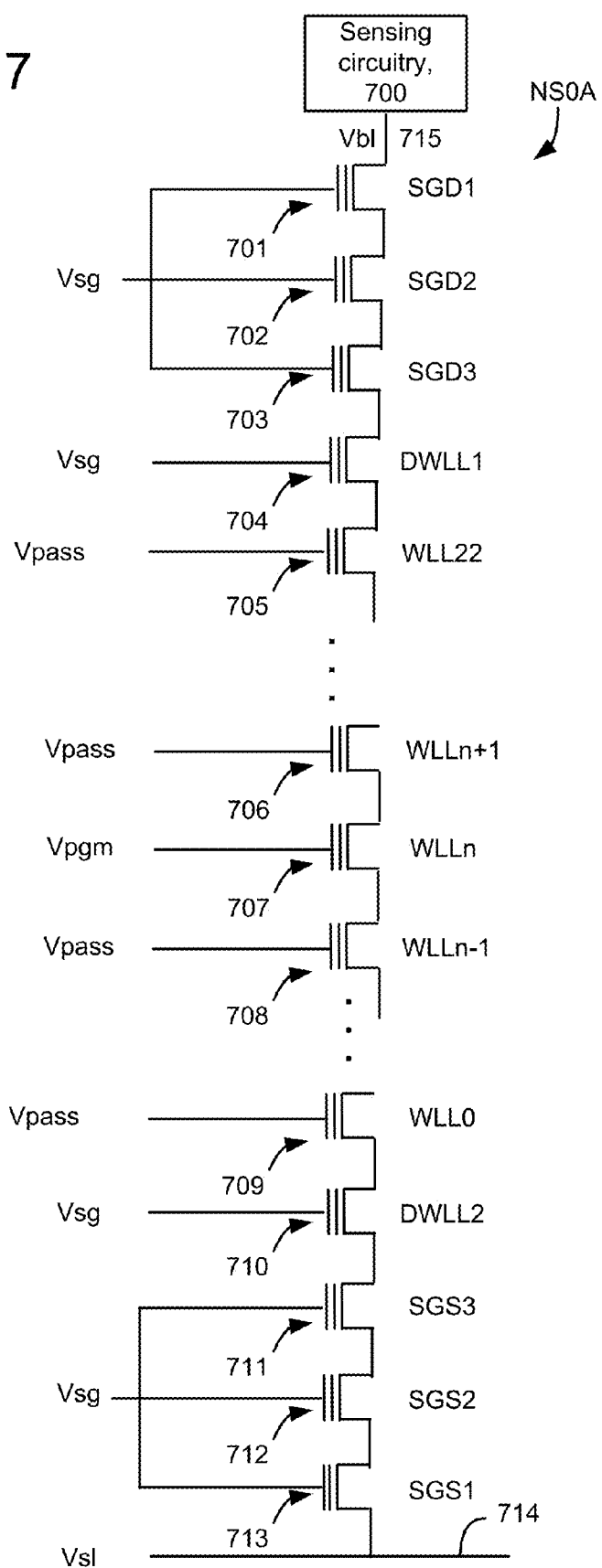
FIG. 7 depicts a circuit diagram of a NAND string consistent with the memory devices of FIGS. 2C, 3C and 5B.

FIG. 7 depicts a circuit diagram of a NAND string consistent with the memory devices of FIGS. 2C, 3C and 5B. An example NAND string NS0A includes SGD transistors 701, 702 and 703, a drain-side dummy memory cell 704, data-storing memory cells 705, . . . , 706, 707, 708, . . . , 709, a source-side dummy memory cell 710, and SGS transistors 711, 712 and 713. A bit line 715 connects the drain end of the NAND string to sensing circuitry 700, which is used to sense the NAND string during operations involving the select gate transistors and the memory cells. A source line 714 is connected to a source end of the NAND string. Voltage drivers can be used to provide the voltages depicted. For example, Vsg is applied to the control gates of the SGD transistors, which are connected to one another and to the control gates of the SGS transistors, which are connected to one another. Vsg can also be applied to the dummy memory cells 704 and 710. Vbl is the bit line voltage and Vsl is the source line voltage.

A similar circuit diagram can be provided for the NAND string 530 of FIG. 5B by omitting the extra select gate transistors and the dummy memory cells.

In this example, the memory cell 707 is selected for programming and is connected to a selected word line WLLn which receives Vpgm. The memory cell 708 is an adjacent, previously-programmed memory cell which is connected to a word line WLLn−1 which receives Vpass. The memory cell 706 is an adjacent, later-programmed memory cell which is connected to a word line WLLn+1 which receives Vpass. The remaining word lines, which are not adjacent to WLLn, including WLL0 to WLLn−2 and WLLn+2 to WLL22, can also receive a pass voltage. In some cases, the pass voltage on the adjacent word lines of the selected word line is optimized separately from the pass voltages on non-adjacent word lines of the selected word line.

FIG. 8A depicts an example programming operation which reduces short-term charge loss in memory cells. Step 800 begins a programming operation for a set of memory cells connected to a word line. Step 801 involves performing a rough programming pass for the set of memory cells based on their different target data states. A target data state is a data state that a memory cell is to be programmed to based on write data. A rough programming pass generally refers to a programming pass which is before a final programming pass. The rough programming pass may include programming without verification for one or more target data states. The programming pass is rough because the programming does not have to be as accurate as the final programming pass. That is, the Vth levels of the memory cells can be provided in relatively wide Vth distributions which are close to and/or below, final, relatively narrow Vth distributions.

After step 801, one of three options may be followed. Step 802 provide a first option. See also FIG. 8C. This option performs incremental step pulse programming (ISPP) for the lowest target data state, and determines a programming speed of the memory cells with the lowest target data state based on this programming. For example, the lowest target data state may be the A state. ISPP generally involves a sequence of program-verify iterations, where each program-verify iteration (also referred to as a program loop) comprises a program pulse followed by one or more verify tests. ISPP thus involves programming following by an assessment of whether additional programming is needed for memory cells to reach one or more verify levels. ISPP provides a relatively narrow Vth distribution for memory cells of a given target data state. The programming speed can be determined, e.g., based on a count of memory cells which have a Vth which exceeds a specified level at a specified program loop, or based on a number of program loops which are used to cause a specified number of memory cells to have a Vth which exceeds a specified level.

The completion of the ISPP programming may occur when at least a specified number of the A state memory cells have passed a verify test using a verify voltage of VvAr, for example. See FIG. 10A. Or, the completion of the ISPP programming may occur when a specified number of program loops have been performed.

At step 803, after detecting a completion of the ISPP, single pulse programming is performed without a verify test for each data state of the remaining data states. For example, these could be the B and C state in a four state memory device, or the A, B, C, D, E, F and G states in an eight state memory device. In one approach, single pulse programming involves applying a single programming pulse to a word line without performing a verify test, for each of the remaining data states. Single pulse programming provides a relatively wide Vth distribution for memory cells of a given target data state. An optimum magnitude and duration of a single programming pulse can be determined by testing. The duration of a programming pulse in single pulse programming is typically longer than in ISPP. During the single pulse for the B state cells, programming can be enabled for the B state cells and inhibited for the other cells. Similarly, during the single pulse for the C state cells, programming can be enabled for the C state cells and inhibited for the other cells.

Step 804 involves setting an initial Vpgm based on the programming speed. For example, as described in FIG. 8B, the initial program voltage is relatively lower when the programming speed is relatively faster. This helps avoid over-programming. On the other hand, the initial program voltage is relatively higher when the programming speed is relatively slower. This helps avoid an excessive programming time. This approach can determine an optimal initial Vpgm for each word line. The optimal initial Vpgm can vary for different word lines for various reasons. For example, memory cells on end word lines may perform differently than memory cells on interior word lines. Also, in a 3D memory device, the diameter of the memory holes can vary along the height of the stack, so that memory cells on different word line have a programming speed which is based on their height in the stack, e.g., their position along the memory hole. Memory cells which are adjacent to a relatively narrower portion of a memory hole is associated with a relatively faster programming speed.

This option minimizes programming time while obtaining information regarding programming speed of the lowest target data state. It may be assumed that memory cells of other target data states on the same word line have a similar programming speed.

Step 807 involves applying a negative voltage to the selected word line. A drain of each memory cell of the set of memory cells is biased during the applying of at least one negative voltage to the word line to cause the memory cell to have a negative gate-to-drain voltage. For example, the gate can be at −5 V and the drain can be at 0 V so that the gate-to-drain voltage is −5−0=−5 V. The drain voltage can be set by a bit line voltage, for example.

As mentioned, the negative voltage helps to accelerate the charge loss from the shallow traps in the memory cells. After this charge loss, step 808 is performed. See also FIG. 8F. This involves performing an additional (e.g., final) programming pass for the set of memory cells using the initial Vpgm based on the programming speed as determined in step 802 or a default initial Vpgm. The default initial Vpgm can be determined during testing as an optimal value in a block or other group of memory cells.

Step 805 provides a second option after step 801. See also FIG. 8D. This option involves performing ISPP for all target data states and determining a programming speed of the memory cells of one or more target data states. Step 804 can then be used to set the initial Vpgm based on the programming speed. Steps 807 and 808 then follow, as discussed. This option results in a longer programming time than the first option but positions the Vth of the memory cells with the highest accuracy, so that the final programming may be completed more quickly.

Step 806 provides a third option after step 801. See also FIG. 8E. This option involves performing single pulse programming without a verify test for each target data state of the different target data states. In this case, the programming speed is not determined, so a default initial Vpgm is used in the final programming pass. Steps 807 and 808 then follow, as discussed. This option minimizes programming time in the rough programming pass.

FIG. 8B depicts a plot showing the setting of an initial Vpgm in a final programming pass as a function of a count of memory cells or a number of program loops for the lowest target data state in a rough programming pass, consistent with step 804 of FIG. 8A. One option is to count the number of A state cells, for example, which have a Vth above VvAr (or VvA) after four programming loops, for instance. If this count is relatively higher, the programming speed is relatively higher, so Vpgm_initial should be relatively lower during the final programming pass. Another option is to count the number of program loops needed, e.g., for 80% of the A state cells to have a Vth above VvAr. If this number is relatively lower, the programming speed is relatively higher, so Vpgm_initial should be relatively lower during the final programming pass.

FIG. 8C depicts an example process for performing ISPP for the lowest target data state and single pulse programming for the remaining, higher target data states while determining a programming speed during a rough programming pass, consistent with step 802 of FIG. 8A. This process involves a set of memory cells which are connected to a common word line. Step 810 involves initializing Vpgm. Step 811 involves applying Vpgm to the selected word line, while enabling programming of memory cells with the lowest target data state, e.g., the A state (such as by grounding bit lines which are connected to NAND strings in which the A state cells are located), and inhibiting programming of memory cells with the remaining target data states, e.g., the B and C states (such as by raising voltages of bit lines which are connected to NAND strings in which the B and C state cells are located). This is part of a first program-verify iteration in the rough programming pass.

Step 812 involves performing a verify test for memory cells with the lowest data state. For example, the verify test can determine if the A state memory cells have a Vth>VvAr. Step 813 involves counting a number of the memory cells which pass the verify test. At decision step 814, if the count does not exceed a threshold, Vpgm is incremented at step 815 and step 811 is repeated in a next program-verify iteration of the rough programming pass. If decision step 814 is true, step 816 is reached, where programming of the memory cells with the lowest target data state is complete. Subsequently, step 817 selects a remaining target data state to program, e.g., the B state. Step 818 applies a single program pulse to the selected word line, while enabling programming of memory cells of the selected target data state, e.g., the B state (such as by grounding bit lines which are connected to NAND strings in which the B state cells are located), and inhibiting programming of memory cells of the other target data states, e.g., the A and C states (such as by raising voltages of bit lines which are connected to NAND strings in which the A and C state cells are located).

Decision step 819 determines if all target data states have been programmed. If decision step 819 is false, step 817 is repeated. In this case, step 817 selects a remaining target data state to program, e.g., the C state. Step 818 applies a single program pulse to the selected word line, while enabling programming of memory cells of the selected target data state, e.g., the C state (such as by grounding bit lines which are connected to NAND strings in which the C state cells are located), and inhibiting programming of memory cells of the other target data states, e.g., the A and B states (such as by raising voltages of bit lines which are connected to NAND strings in which the A and B state cells are located). If decision step 819 is true, the end of the rough programming pass is reached at step 820.

FIG. 8D depicts an example process for performing ISPP for each target data state while determining a programming speed during a rough programming pass, consistent with step 805 of FIG. 8A. Step 830 involves initializing Vpgm. Step 831 involves applying Vpgm to the selected word line, while enabling programming of all memory cells (of any target data state) which have not completed programming (such as by grounding bit lines which are connected to NAND strings in which these cells are located), and inhibiting programming of memory cells which have completed programming (such as by raising voltages of bit lines which are connected to NAND strings in which these cells are located). This is part of a first program-verify iteration in the rough programming pass.

Figure 11A:
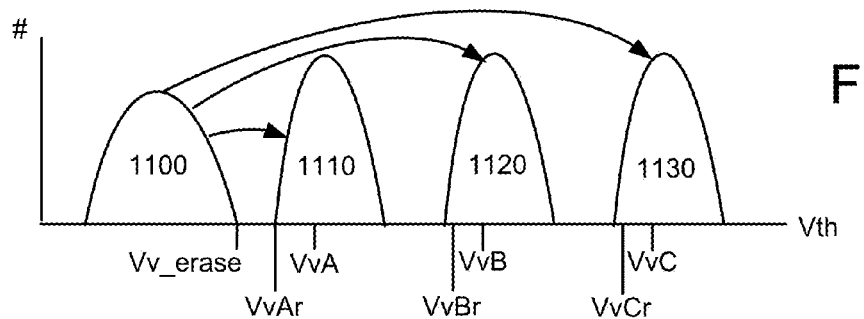
FIG. 11A depicts Vth distributions during rough programming of memory cells, consistent with step 805 of FIG. 8A.

Step 832 involves performing a verify test for memory cells with one or more target data states using rough verify voltages (e.g., VvAr, VvBr or VvCr; see FIG. 11A). Decision step 833 determines if programming of the set of memory cells is completed. This is true when the memory cells of all target data states have completed programming in the rough programming pass. In this case, the end of the rough programming pass is reached at step 835. If decision step 833 is false, Vpgm is incremented at step 834 and step 831 is repeated in a next program-verify iteration of the rough programming pass.

Figure 8E:
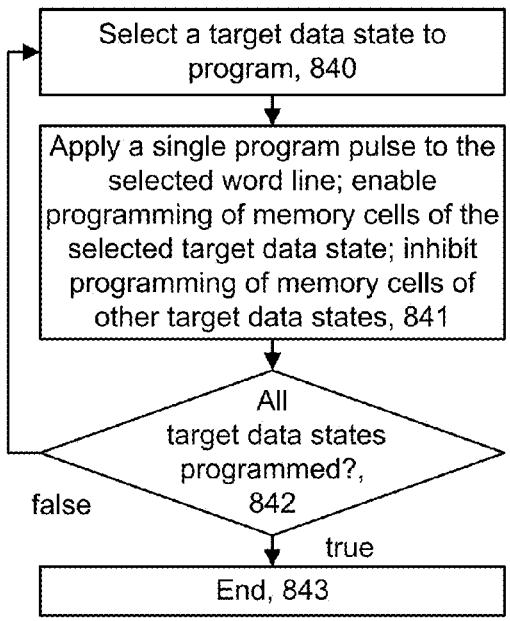
FIG. 8E depicts an example process for performing single pulse programming for each target data state during a rough programming pass, consistent with step 806 of FIG. 8A.

FIG. 8E depicts an example process for performing single pulse programming for each target data state during a rough programming pass, consistent with step 806 of FIG. 8A. Step 840 selects a target data state to program. Step 841 applies a single program pulse to the selected word line while enabling programming of memory cells of the selected target data state and inhibiting programming of memory cells of other target data states. Decision step 842 determines if all target data states have been programmed. If this step is false, step 840 is repeated for another target data state. If this step is true, the rough programming pass ends at step 843.

Figure 8F:
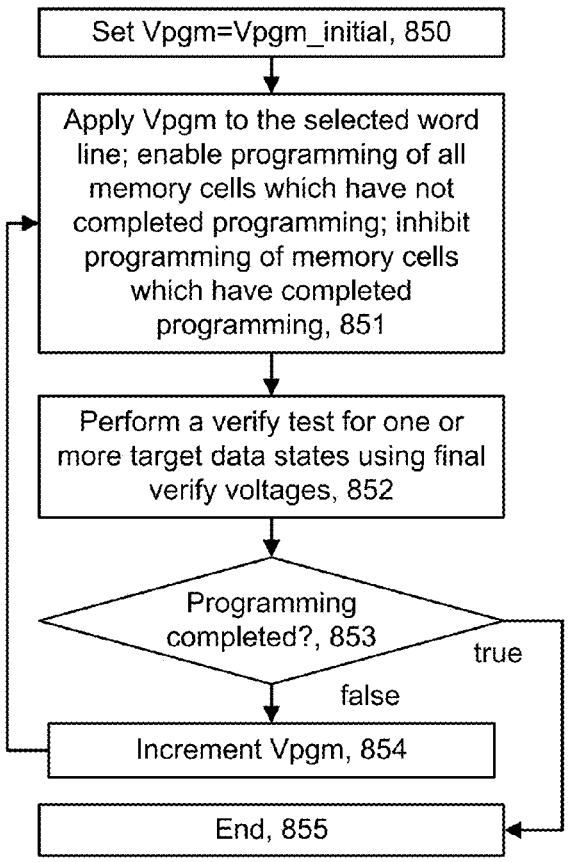
FIG. 8F depicts an example process for performing ISPP in a final programming pass, consistent with step 808 of FIG. 8A.

FIG. 8F depicts an example process for performing ISPP in a final programming pass, consistent with step 808 of FIG. 8A. Step 850 sets Vpgm to Vpgm_initial. This can be a value based on programming speed or a default value. Step 851 applies Vpgm to the selected word line while enabling programming of all memory cells which have not completed programming and inhibiting programming of memory cells which have completed programming. Step 852 performs a verify test for one or more target data states using final verify voltages, e.g., VvA, VvB or VvC. See FIG. 10D or 11C. Decision step 853 determines if programming is completed for all data states. If decision step 853 is false, Vpgm is incremented at step 854 and a next program-verify iteration is performed at step 851. If decision step 853 is true, the final programming pass ends at step 855. The programming operation which comprises the rough programming pass and the final programming pass also ends.

Figure 9A:
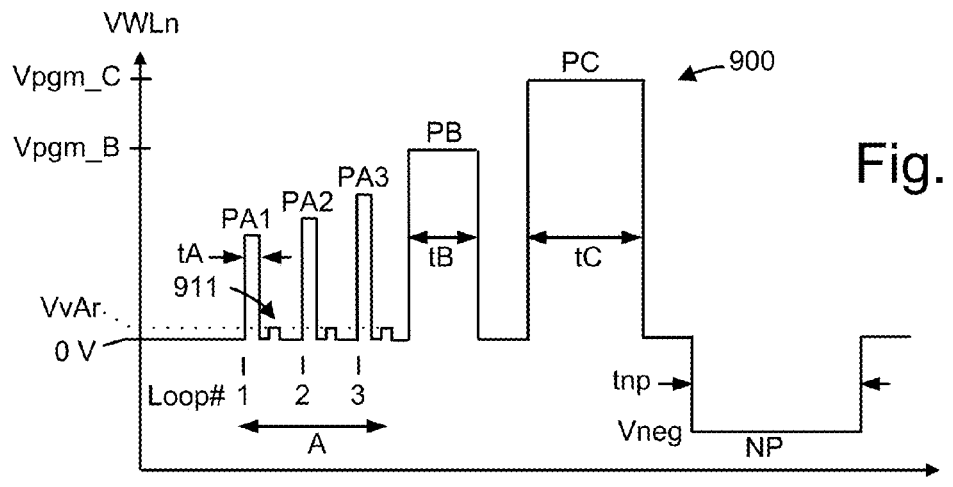
FIG. 9A depicts voltages applied to a word line in a rough programming pass, consistent with steps 802 and 803 of FIG. 8A.

FIG. 9A depicts voltages applied to a word line in a rough programming pass, consistent with steps 802 and 803 of FIG. 8A. In FIG. 9A to 9D, the horizontal axis depicts time, or a number of program loops or program-verify iterations, and the vertical axis depicts voltage on a selected word line, VWLn, or otherwise on control gates of memory cells. The programming pass comprises a waveform 900. ISPP is performed for the A state memory cells using program loops 1-3. Program loops 1, 2 and 3 comprise program pulses PA1, PA2 and PA3, respectively, followed by verify voltages at a level of VvAr (e.g., see example verify voltage 911). In this example, the rough programming of the A state cells is completed after the third program loop. Each program pulse for the A state has a duration of tA. Next, programming of the B state is performed using a single pulse PB of duration tB and amplitude Vpgm_B. Next, programming of the C state is performed using a single pulse PC of duration tC and amplitude Vpgm_C. Next, a negative voltage or pulse NP of amplitude Vneg and duration tnp is applied to the selected word line.

Figure 9B:
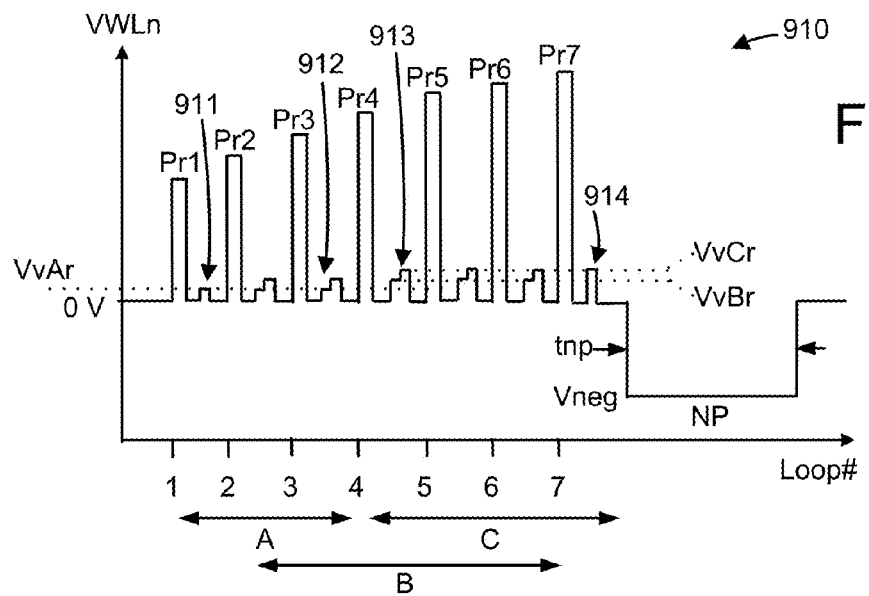
FIG. 9B depicts voltages applied to a word line in a rough programming pass, consistent with step 805 of FIG. 8A.

FIG. 9B depicts voltages applied to a word line in a rough programming pass, consistent with step 805 of FIG. 8A. The programming pass comprises a series of waveforms 910. ISPP is performed for each target data state. This example also performs verify tests based on the program loop. For example, the A, B and C state cells are verified in loops 1-3, 2-6 and 4-7, respectively. An example verify voltage 911 comprises an A state verify voltage at VvAr. An example verify waveform 912 comprises A and B state verify voltages at VvAr and VvBr, respectively. An example verify waveform 913 comprises B and C state verify voltages at VvBr and VvCr, respectively. An example verify waveform 914 comprises a C state verify voltage at VvCr. The negative pulse NP is also depicted. The program pulses Pr1, Pr2, Pr3, Pr4, Pr5, Pr6 and Pr7 are also depicted.

The above techniques can be extended to cases where there are additional data states, e.g., eight or sixteen data states. For example, with eight data states A-G, several phases are possible in a programming operation. For instance, five phases may be used which include these groups of states which are verified concurrently: ABC, BCD, CDE, DEF and EFG. Another example is: ABCD, CDEF and EFG. Many other examples are possible.

Figure 9C:
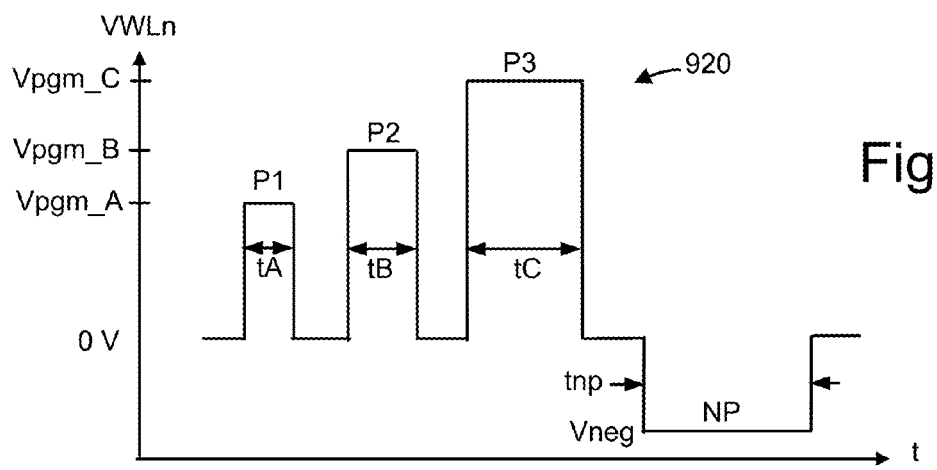
FIG. 9C depicts voltages applied to a word line in a rough programming pass, consistent with step 806 of FIG. 8A.

FIG. 9C depicts voltages applied to a word line in a rough programming pass, consistent with step 806 of FIG. 8A. The programming pass comprises a series of waveforms 920. First, programming of the memory cells of the A state is performed using a single pulse P1 of duration tA and amplitude Vpgm_A. Next, programming of the memory cells of the B state is performed using a single pulse PB of duration tB and amplitude Vpgm_B. Next, programming of the memory cells of the C state is performed using a single pulse PC of duration tC and amplitude Vpgm_C. Next, a negative voltage or pulse NP of amplitude Vneg and duration tnp is applied to the selected word line.

In these examples, the order in which the data state are programmed proceeds from the lowest state to the highest state. However, other orders are possible.

Figure 9D:
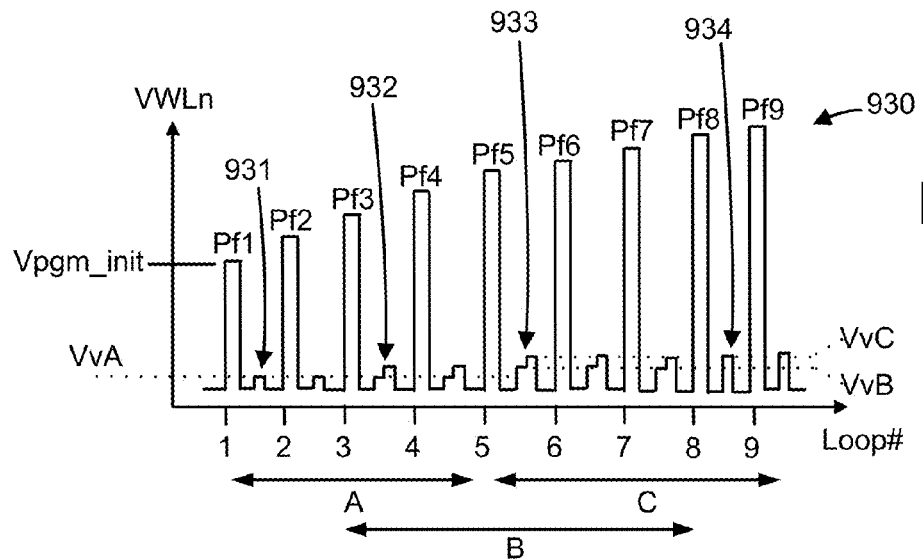
FIG. 9D depicts voltages applied to a word line in a final programming pass, consistent with step 808 of FIG. 8A.

FIG. 9D depicts voltages applied to a word line in a final programming pass, consistent with step 808 of FIG. 8A. The programming pass comprises a series of waveforms 930. ISPP is performed for each target data state. This example also performs verify tests based on the program loop. For example, the A, B and C state cells are verified in loops 1-4, 3-7 and 5-9, respectively. An example verify waveform 931 comprises an A state verify voltage at VvA. An example verify waveform 932 comprises A and B state verify voltages at VvA and VvB, respectively. An example verify waveform 933 comprises B and C state verify voltages at VvB and VvC, respectively. An example verify waveform 934 comprises a C state verify voltage at VvC. The program pulses Pf1 (with amplitude Vpgm_initial), Pf2, Pf3, Pf4, Pf5, Pf6, Pf7, Pf8 and Pf9 are also depicted. The verify levels used in the final programming pass are higher than in the rough programming pass, so that the memory cells undergo a small amount of additional programming. This allows the Vth distributions to be narrowed and provided at the appropriate levels for subsequent read back. Moreover, since charge loss has been accelerated by the negative pulse in the prior rough programming, charge loss after the final programming pass is reduced. Vth widening is therefore also reduced. Note that a negative pulse is not applied during the final programming pass, in this example.

Figure 9E:
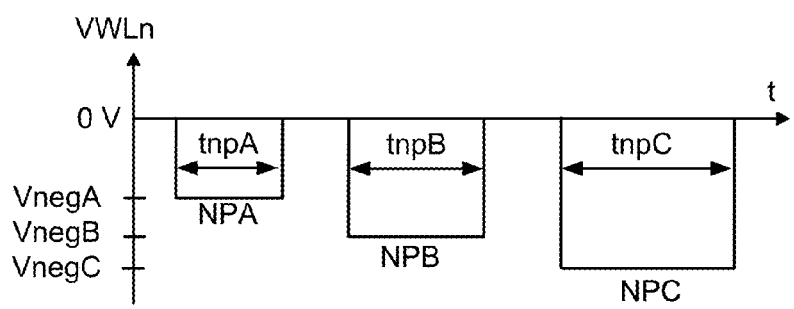
FIG. 9E depicts an option for using a separate negative voltage for each target data state.

FIG. 9E depicts an option for using a separate negative voltage for each target data state. This sequence of negative voltages can be used in place of the single negative voltage of FIG. 9A to 9C, for instance. This approach allows the magnitude and duration of the negative voltage to be optimized for each target data state.

A negative voltage NPA with a duration tnpA and magnitude VnegA is used for the memory cells of the A state. During this voltage (one negative voltage), the drain of the A state cells (one target data state) can be biased differently than drains of the B and C state cells so that the A state cells have a gate-to-drain voltage which is higher in magnitude than a magnitude of a gate-to-drain voltage of the memory cells of the B and C state cells (another target data state). The voltage at the drain of each cell can be set by a voltage of a respective bit line of a NAND string of the memory cell. For example, VnegA can be −5 V, while the drain of the A state cells can be 0 V while the drain of the B and C state cells is −5 V. In this case, the A state cells have a gate-to-drain voltage of −5−0=−5 V and the B and C state cells have a gate-to-drain voltage of −5−(−5)=0 V. The effect of the negative voltage on the control gate is therefore cancelled for the B and C state cells out by setting the drain at a similar level.

A negative voltage NPB with a duration tnpB and magnitude VnegB is used for the memory cells of the B state. During this bias (one negative voltage), the drain of the B state cells (one target data state) can be biased differently than drains of the A and C state cells so that the B state cells have a gate-to-drain voltage which is higher in magnitude than a magnitude of a gate-to-drain voltage of the memory cells of the A and C state cells (another target data state). For example, VnegB can be −7 V, the drain of the B state cells can be 0 V while the drain of the A and C state cells is −7 V.

A negative voltage NPC with a duration tnpC and magnitude VnegC is used for the memory cells of the C state. During this bias (one negative voltage), the drain of the C state cells (one target data state) can be biased differently than drains of the A and B state cells so that the C state cells have a gate-to-drain voltage which is higher in magnitude than a magnitude of a gate-to-drain voltage of the memory cells of the A and B state cells (another target data state). For example, VnegC can be −9 V, the drain of the C state cells can be 0 V while the drain of the A and C state cells is −9 V.

When there are additional data states, one negative voltage can be used for multiple adjacent states. For example, with target data states of A-G, the A, B and C states can be subject to a first negative voltage, the D and E states can be subject to a second negative voltage and the F and G states can be subject to a third negative voltage. A memory cell is subject to a negative voltage when the charge loss effect of the negative voltage is not cancelled out by raising a voltage of a drain of the memory cell.

Various memory devices allow the control of a bit line voltage for a respective memory cell. For example, in a 3D memory device such as in FIG. 3A, the memory cells which are connected to one word line layer and to a common SGD line will be in different NAND strings, where each NAND string is connected to a separate bit line. In a 2D memory device such as in FIG. 5B, the memory cells which are connected to one word line will be in different NAND strings, where each NAND string is connected to a separate bit line.

Figure 10A:
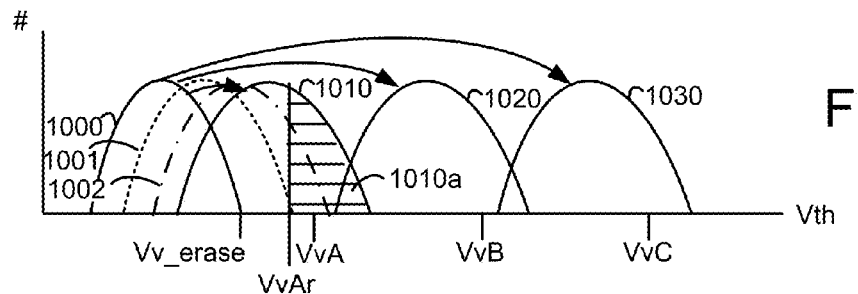
FIG. 10A depicts Vth distributions during rough programming of memory cells, consistent with steps 802 and 803 of FIG. 8A.

FIG. 10A depicts Vth distributions during rough programming of memory cells, consistent with steps 802 and 803 of FIG. 8A. In FIG. 10A to 10D, the horizontal axis depicts Vth and the vertical axis depicts a number of memory cells. The horizontal axes are time-aligned. This example is consistent with FIG. 9A. ISPP is performed for the A state and single pulse programming is performed for the B and C states.

The memory cells are initially erased to the erased state as represented by a Vth distribution 1000 and a verify voltage Vv_erase. The erase operation can include multiple erase-verify iterations, where the erase operation is completed when all or most of the memory cells have a Vth<Vv_erase. The A state cells are programmed in first, second and third program loops to Vth distributions 1001, 1002 and 1010, respectively. A verify test can be performed in each loop using the verify voltage of VvAr. A region 1010 indicates a number of A state cells which have a Vth above VvAr. These cells have passed the A state verify test of the rough programming pass. The final verify voltages VvA, VvB and VvC are depicted for comparison. The B state cells are programmed from the Vth distribution 1000 to the Vth distribution 1020 using a single programming pulse. The C state cells are programmed from the Vth distribution 1000 to the Vth distribution 1030 using another single programming pulse.

As can be seen, after the rough programming pass, some of the A, B and C state cells may have a Vth greater than VvA, VvB or VvC, respectively. Typically, a majority of the A, B and C state cells may have a Vth less than VvA, VvB or VvC, respectively.

Figure 10B:
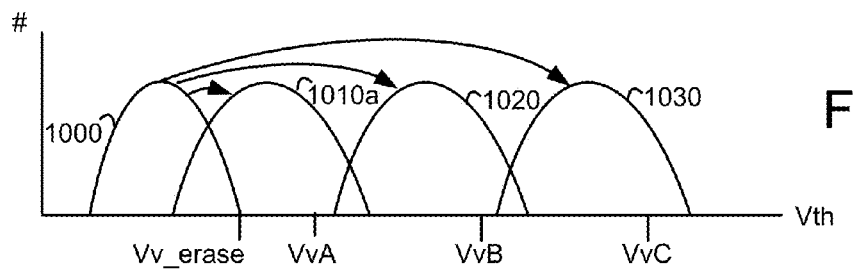
FIG. 10B depicts Vth distributions during rough programming of memory cells, consistent with step 806 of FIG. 8A.

FIG. 10B depicts Vth distributions during rough programming of memory cells, consistent with step 806 of FIG. 8A. The memory cells are initially erased to the erased state as represented by a Vth distribution 1000 and a verify voltage Vv_erase. Single pulse programming is then performed for the A, B and C states. The A, B and C state cells are programmed to Vth distributions 1010a, 1020 and 1030, respectively, using respective single program pulses.

Optionally, it is possible to use one program pulse to program cells of multiple target data state. For example, the B and C state cells can be programmed together to the Vth distribution 1020. This approach saves programming in the rough programming pass, although additional programming time may be needed in the final programming pass for the C state. Also, when there are eight or sixteen states, adjacent states can be programmed together by a single programming pulse. For example, with target data states of A-G, the A, B and C states can be programmed by a first program pulse, the D and E states can be programmed by a second program pulse, and the F and G states can be programmed by a third program pulse Other options are possible as well.

Figure 10C:
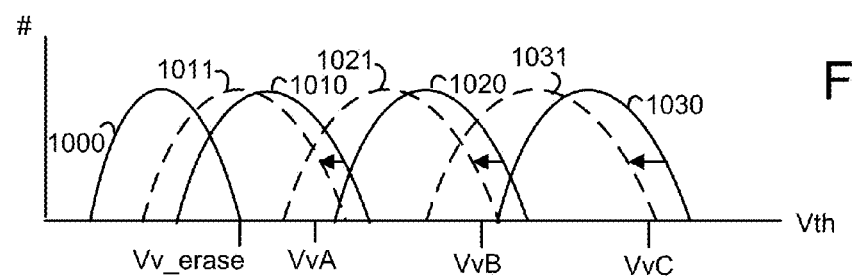
FIG. 10C depicts Vth distributions which follow the Vth distributions of FIG. 10A or 10B after applying a negative voltage to a selected word line, consistent with step 807 of FIG. 8A.

FIG. 10C depicts Vth distributions which follow the Vth distributions of FIG. 10A or 10B after applying a negative voltage to a selected word line, consistent with step 807 of FIG. 8A. As mentioned, the negative voltage accelerates charge loss in the memory cells so that the Vth distribution shifts lower and widens. The shifting and lowering may be stronger for memory cells of the higher data states because these memory cells have more electrons programmed into their charge-trapping regions. For example, the Vth distribution 1010 of the A state in FIG. 10A may shift to a Vth distribution 1011. The Vth distribution 1020 of the B state in FIG. 10A or 10B may shift to a Vth distribution 1021. The Vth distribution 1030 of the C state in FIG. 10A or 10B may shift to a Vth distribution 1031.

Figure 10D:
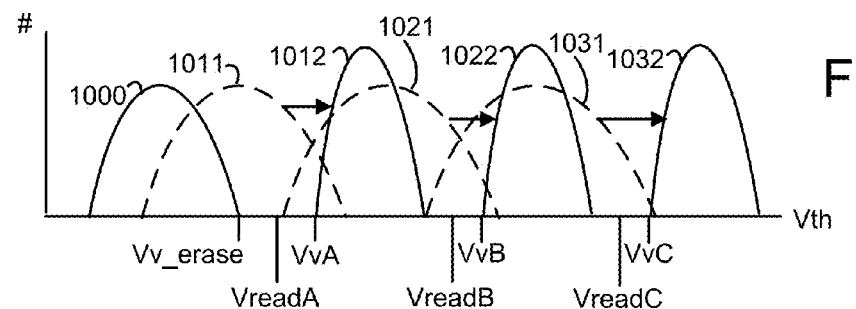
FIG. 10D depicts Vth distributions which follow the Vth distributions of FIG. 10C, after performing a final programming pass, consistent with step 808 of FIG. 8A.

FIG. 10D depicts Vth distributions which follow the Vth distributions of FIG. 10C, after performing a final programming pass, consistent with step 808 of FIG. 8A. The A, B and C state cells are programmed using ISPP and verify voltages of VvA, VvB and VvC, respectively. The Vth distribution 1011 of the A state in FIG. 10C is moved up and narrowed to provide the Vth distribution 1012. The Vth distribution 1021 of the B state in FIG. 10C is moved up and narrowed to provide the Vth distribution 1022. The Vth distribution 1031 of the C state in FIG. 10C is moved up and narrowed to provide the Vth distribution 1032. Read voltages VreadA, VreadB and VreadC can be used to subsequently read back data from the memory cells, where each Vth distribution represents a different two bits of data.

FIG. 11A depicts Vth distributions during rough programming of memory cells, consistent with step 805 of FIG. 8A. The memory cells are initially erased to the erased state as represented by a Vth distribution 1100 and a verify voltage Vv_erase. Memory cells of each target data state are then programmed using ISPP and verify voltages of VvAr, VvBr or VvCr, to achieve Vth distributions 1110, 1120 and 1130, respectively.

Figure 11B:
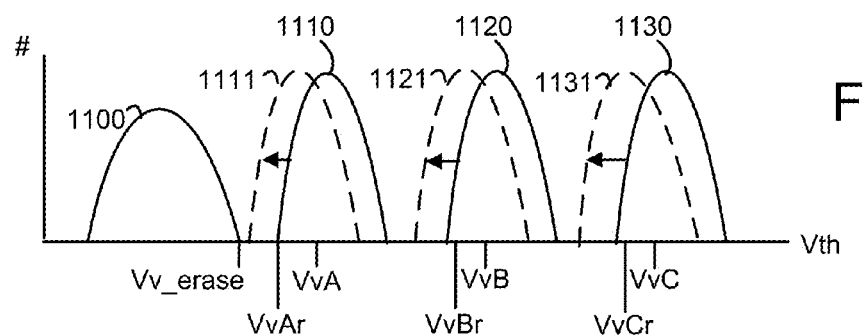
FIG. 11B depicts Vth distributions which follow the Vth distributions of FIG. 11A after applying a negative voltage to a selected word line, consistent with step 807 of FIG. 8A.

FIG. 11B depicts Vth distributions which follow the Vth distributions of FIG. 11A after applying a negative voltage to a selected word line, consistent with step 807 of FIG. 8A. Due to the charge loss which is caused by the negative voltage, the Vth distributions 1110, 1120 and 1130 of FIG. 11A are shifted lower to Vth distributions 1111, 1121 and 1131, respectively.

Figure 11C:
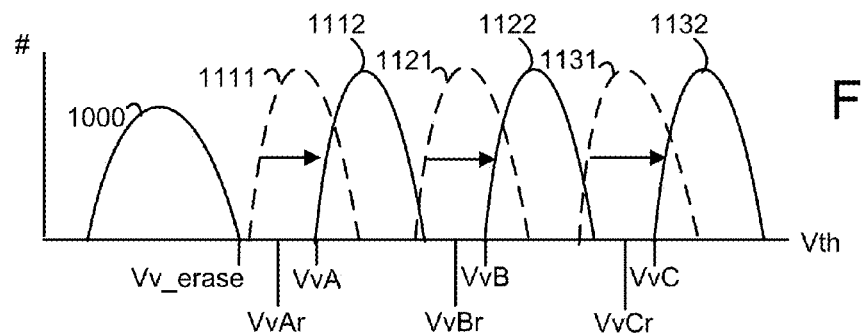
FIG. 11C depicts Vth distributions which follow the Vth distributions of FIG. 11B, after performing a final programming pass, consistent with step 808 of FIG. 8A.

FIG. 11C depicts Vth distributions which follow the Vth distributions of FIG. 11B, after performing a final programming pass, consistent with step 808 of FIG. 8A. The A, B and C state cells are programmed using ISPP and verify voltages of VvA, VvB and VvC, respectively. The Vth distribution 1111 of the A state in FIG. 11B is moved up and narrowed to provide the Vth distribution 1112. The Vth distribution 1121 of the B state in FIG. 11B is moved up and narrowed to provide the Vth distribution 1122. The Vth distribution 1131 of the C state in FIG. 11B is moved up and narrowed to provide the Vth distribution 1132.

Accordingly, it can be seen that, in one embodiment, a method for programming in a memory device comprises: performing rough programming of a set of memory cells to threshold voltages comprising threshold voltages which are below final verify voltages of different target data states, the memory cells are connected to a word line, the set of memory cells comprises memory cells of one target data state (e.g., A) of the different target data states and memory cells of another target data state (e.g., B or C) of the different target data states, the final verify voltages of the different target data states comprise one final verify voltage (e.g., VvA) of the one target data state and another final verify voltage (e.g., VvB or VvC) of the another target data state, and the another final verify voltage is greater than the one final verify voltage; after the rough programming, applying at least one negative voltage to the word line; and after the applying the at least one negative voltage to the word line, performing additional programming of the set of memory cells to threshold voltages which are above the final verify voltages of the different target data states.

In another embodiment, a memory device comprises: a set of memory cells connected to a word line, the set of memory cells comprises memory cells with different target data states; and a control circuit. The control circuit is configured to: perform rough programming of the set of memory cells, the rough programming does not use a verify test for at some of the memory cells, after the rough programming, apply at least one negative voltage to the word line, and after the at least one negative voltage is applied to the word line, perform additional programming of the set of memory cells, the additional programming uses a verify test for each memory cell in the set of memory cells.

In another embodiment, a memory device comprises: a set of memory cells connected to a word line, the set of memory cells comprises memory cells with different target data states; and a control circuit. The control circuit: programs memory cells of the set of memory cells which have a lowest target data state of the different target data states using incremental step pulse programming; determines when the memory cells of the lowest target data state reach a programming milestone; in response to the memory cells of the lowest target data state reaching the programming milestone, applies a single programming pulse to the word line for each remaining target data state of the different target data states without performing a verify test; after the single programming pulse is applied to the word line for each remaining target data state of the different target data states, applies at least one negative voltage to the word line; and after the at least one negative voltage is applied to the word line, performs additional programming of the set of memory cells, the additional programming comprises incremental step pulse programming for each memory cell in the set of memory cells.

In another embodiment, a method for programming in a memory device comprises: programming memory cells of different target data states to threshold voltages comprising threshold voltages which are below final verify voltages of different target data states, the memory cells comprise charge trapping regions; applying a negative voltage to control gates of the memory cells; and after the applying of the negative voltage, programming the memory cells to threshold voltages which are above the final verify voltages.

In another embodiment, a memory device comprises: a set of memory cells connected to a word line, the set of memory cells comprises memory cells of one target data state (e.g., A) of different target data states and memory cells of another target data state (e.g., B or C) of the different target data states; and a control circuit. The control circuit is configured to: perform rough programming of the set of memory cells to threshold voltages comprising threshold voltages which are below final verify voltages of the different target data states, the final verify voltages of the different target data states comprise one final verify voltage (e.g., VvA) of the one target data state and another final verify voltage (e.g., VvB or VvC) of the another target data state, and the another final verify voltage is greater than the one final verify voltage, after the rough programming, apply at least one negative voltage to the word line, and after the at least one negative voltage is applied to the word line, perform additional programming of the set of memory cells to threshold voltages which are above the final verify voltages of the different target data states.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming in a memory device, comprising:
performing rough programming of a set of memory cells to threshold voltages comprising threshold voltages which are below final verify voltages of different target data states, the memory cells are connected to a word line, the set of memory cells comprises memory cells of one target data state of the different target data states and memory cells of another target data state of the different target data states, the final verify voltages of the different target data states comprise one final verify voltage of the one target data state and another final verify voltage of the another target data state, and the another final verify voltage is greater than the one final verify voltage;
after the rough programming, applying at least one negative voltage to the word line; and
after the applying the at least one negative voltage to the word line, performing additional programming of the set of memory cells to threshold voltages which are above the final verify voltages of the different target data states.

2. The method of claim 1, wherein:
the performing the rough programming of the set of memory cells comprises applying a single program pulse on the word line while enabling programming of the memory cells of the one target data state and while inhibiting programming of the memory cells of the another target data state, without performing a verify test for the memory cells of the one target data state.

3. The method of claim 2, wherein:
the performing the rough programming of the set of memory cells comprises applying another single program pulse on the word line while enabling programming of the memory cells of the another target data state and while inhibiting programming of the memory cells of the one target data state, without performing a verify test for the memory cells of the another target data state; and
the another single program pulse has an amplitude which is higher than an amplitude of the single programming pulse.

4. The method of claim 2, wherein:
the additional programming comprises incremental step pulse programming for each target data state of the different target data states.

5. The method of claim 1, wherein:
the performing the rough programming of the memory cells comprises performing incremental step pulse programming for the memory cells of the one target data state.

6. The method of claim 5, wherein:
the performing the rough programming of the memory cells comprises detecting a completion of the rough programming for the memory cells of the one target data state; and in response to the detecting, applying a single program pulse on the word line while enabling programming of the memory cells of the another target data state and inhibiting programming of the memory cells of the one target data state, without performing a verify test for the memory cells of the another target data state.

7. The method of claim 5, wherein the performing incremental step pulse programming for the memory cells of the one target data state comprises applying program pulses to the word line while enabling programming of the memory cells of the one target data state, the method further comprising:
determining a number of the program pulses which are used when at least a specified number of the memory cells of the one target data state pass a verify test; and
determining an initial program voltage for the additional programming based on the number, wherein the additional programming comprises incremental step pulse programming, and the initial program voltage is relatively lower when the number is relatively lower.

8. The method of claim 5, further comprising:
detecting a programming speed of the memory cells of the one target data state during the incremental step pulse programming for the memory cells of the one target data state; and
determining an initial program voltage for the additional programming based on the programming speed, wherein the additional programming comprises incremental step pulse programming and the initial program voltage is relatively lower when the programming speed is relatively faster.

9. The method of claim 5, further comprising:
initiating programming of the memory cells of the another target data state when the memory cells of the one target data state reach a programming milestone during the incremental step pulse programming.

10. The method of claim 1, further comprising:
for each memory cell of the set of memory cells, biasing a drain of the memory cell during the applying of the at least one negative voltage to the word line to cause the memory cell to have a negative gate-to-drain voltage.

11. The method of claim 10, wherein:
the drains of the memory cells of the one target data state and the drains of the memory cells of the another target data state are biased via respective bit lines.

12. The method of claim 1, wherein:
the applying the at least one negative voltage to the word line comprises:
applying one negative voltage to the word line while biasing drains of the memory cells of the one target data state and drains of the memory cells of the another target data state so that the memory cells of the one target data state have a gate-to-drain voltage which is higher in magnitude than a magnitude of a gate-to-drain voltage of the memory cells of the another target data state; and
applying another negative voltage to the word line while biasing the drains of the memory cells of the one target data state and the drains of the memory cells of the another target data state so that the gate-to-drain voltage of the memory cells of the another target data state is higher in magnitude than the magnitude of the gate-to-drain voltage of the memory cells of the one target data state.

13. The method of claim 12, wherein:
a magnitude of the another negative voltage is higher than a magnitude of the one negative voltage.

14. A memory device, comprising:
a set of memory cells connected to a word line, the set of memory cells comprises memory cells with different target data states; and
a control circuit, the control circuit is configured to:
perform rough programming of the set of memory cells, the rough programming does not use a verify test for at least some of the memory cells,
after the rough programming, apply at least one negative voltage to the word line, and
after the at least one negative voltage is applied to the word line, perform additional programming of the set of memory cells, the additional programming uses a verify test for each memory cell in the set of memory cells.

15. The memory device of claim 14, wherein the rough programming uses a verify test for a lowest target data state of the different target data states, the method further comprising;
determining a programming speed of memory cells of the lowest target data state during the rough programming; and
determining an initial program voltage for the additional programming based on the programming speed, where the initial program voltage is relatively lower when the programming speed is relatively faster.

16. The memory device of claim 15, wherein:
the rough programming does not use a verify test for higher target data states of the different target data states.

17. The memory device of claim 14, wherein:
the set of memory cells comprises charge-trapping memory cells.

18. The memory device of claim 14, wherein:
the set of memory cells is in a three-dimensional stacked memory structure comprising alternating conductive layers and dielectric layers; and
the set of memory cells is connected to one of the conductive layers.

19. The memory device of claim 14, wherein:
the set of memory cells is arranged in a three-dimensional structure.

20. A memory device, comprising:
a set of memory cells connected to a word line, the set of memory cells comprises memory cells with different target data states; and
a control circuit, the control circuit:
programs memory cells of the set of memory cells which have a lowest target data state of the different target data states using incremental step pulse programming;
determines when the memory cells of the lowest target data state reach a programming milestone;
in response to the memory cells of the lowest target data state reaching the programming milestone, applies a single programming pulse to the word line for each remaining target data state of the different target data states without performing a verify test;
after the single programming pulse is applied to the word line for each remaining target data state of the different target data states, applies at least one negative voltage to the word line; and
after the at least one negative voltage is applied to the word line, performs additional programming of the set of memory cells, the additional programming comprises incremental step pulse programming for each memory cell in the set of memory cells.

21. The memory device of claim 20, wherein:
the control circuit biases a drain of each memory cell of the set of memory cells when the at least one negative voltage is applied to the word line to cause each memory cell of the set of memory cells to have a negative gate-to-drain voltage.

22. The memory device of claim 20, wherein:
the control circuit sets an initial program voltage of the incremental step pulse programming of the additional programming based on a number of program pulses which are applied to the word line before the memory cells of the lowest target data state reach the programming milestone; and
the initial program voltage is relatively lower when the number is relatively lower.

23. A method for programming in a memory device, comprising:
programming memory cells of different target data states to threshold voltages comprising threshold voltages which are below final verify voltages of different target data states, the memory cells comprise charge trapping regions;
applying a negative voltage to control gates of the memory cells; and
after the applying of the negative voltage, programming the memory cells to threshold voltages which are above the final verify voltages.

24. The method of claim 23, wherein:
the programming of the memory cells to the threshold voltages comprising threshold voltages which are below the final verify voltages does not use incremental step pulse programming for at least one target data state of the different target data states; and
the programming of the memory cells to the threshold voltages which are above the final verify voltages uses incremental step pulse programming for each target data state of the different target data states.

25. The method of claim 24, wherein:
the programming of the memory cells to the threshold voltages comprising threshold voltages which are below the final verify voltages uses incremental step pulse programming for at least another target data state of the different target data states.

* * * * *